United States Patent
Shibahara et al.

(10) Patent No.: US 7,295,089 B2
(45) Date of Patent: *Nov. 13, 2007

(54) SURFACE ACOUSTIC WAVE FILTER AND COMMUNICATION APPARATUS

(75) Inventors: Teruhisa Shibahara, Kanazawa (JP); Norihiko Nakahashi, Ishikawa-ken (JP); Hiroki Watanabe, Ishikawa-ken (JP); Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 396 days.

This patent is subject to a terminal disclaimer.

(21) Appl. No.: 10/773,818

(22) Filed: Feb. 6, 2004

(65) Prior Publication Data

US 2004/0196119 A1  Oct. 7, 2004

(30) Foreign Application Priority Data

Feb. 24, 2003 (JP) ............................ 2003-046269
Dec. 4, 2003 (JP) ............................ 2003-406255

(51) Int. Cl.
*H03H 9/64* (2006.01)
(52) U.S. Cl. .................... 333/193; 333/195; 310/313 B
(58) Field of Classification Search ................. 333/193
See application file for complete search history.

(56) References Cited

U.S. PATENT DOCUMENTS

| | | | |
|---|---|---|---|
| 3,582,540 A | 6/1971 | Adler | 348/507 |
| 3,582,840 A | 6/1971 | De Vries | 333/193 |
| 4,037,181 A * | 7/1977 | Ieki et al. | 333/193 |
| 4,065,734 A * | 12/1977 | Takeno et al. | 333/150 |
| 5,694,095 A | 12/1997 | Mineyoshi | 333/193 |
| 5,847,626 A | 12/1998 | Taguchi et al. | 333/193 |
| 5,914,646 A | 6/1999 | Hashimoto | 333/195 |
| 6,369,672 B1 | 4/2002 | Ikada | |
| 6,404,303 B1 * | 6/2002 | Kuroda | 333/193 |
| 6,693,501 B2 | 2/2004 | Sawada et al. | |
| 6,879,086 B2 * | 4/2005 | Takamine | 310/313 D |
| 6,930,570 B2 * | 8/2005 | Nakamura et al. | 333/193 |
| 7,046,102 B2 * | 5/2006 | Nakamura et al. | 333/133 |

(Continued)

FOREIGN PATENT DOCUMENTS

EP  0 913 935  5/1999

(Continued)

OTHER PUBLICATIONS

Official Communication dated Jan. 13, 2006, issued in the corresponding European Patent Application No. 04290489.6-2215.

(Continued)

*Primary Examiner*—Barbara Summons
(74) *Attorney, Agent, or Firm*—Keating & Bennett, LLP

(57) ABSTRACT

A surface acoustic wave (SAW) filter includes a piezoelectric substrate. A resin pattern having a permittivity less than that of the piezoelectric substrate and first and second conductor patterns are disposed on the piezoelectric substrate. The first conductor pattern defines two one-terminal-pair SAW resonators and two longitudinally coupled resonator SAW filters. A portion of the second conductor pattern defines wiring traces having different potentials. Portions of the wiring traces facing each other in a plan view are disposed on the resin pattern.

12 Claims, 25 Drawing Sheets

U.S. PATENT DOCUMENTS

| | | |
|---|---|---|
| 7,075,391 B2 | 7/2006 | Nakamura et al. |
| 2006/0164184 A1 | 7/2006 | Nakamura et al. |

FOREIGN PATENT DOCUMENTS

| | | |
|---|---|---|
| EP | 1 079 521 A1 | 12/2001 |
| JP | 52-9389 A | 1/1977 |
| JP | 3-16409 A | 1/1991 |
| JP | 05-167387 | 7/1993 |
| JP | 05-235684 | 9/1993 |
| JP | 07-030362 | 1/1995 |
| JP | 07-297675 | 11/1995 |
| JP | 11-122071 A | 4/1999 |
| JP | 2000-049567 | 2/2000 |
| JP | 2000-138553 | 5/2000 |
| JP | 2000-261344 A | 9/2000 |
| JP | 2002-043892 A | 2/2002 |
| JP | 2002-290203 A | 10/2002 |
| JP | 2003-204243 A | 7/2003 |
| JP | 2003-332874 | * 11/2003 |

OTHER PUBLICATIONS

Official Communication issued in the corresponding Chinese Application No. 2004100055833, mailed on Aug. 25, 2006.

Official communication issued in the counterpart Chinese Application No. 200410005583.3, mailed on May 25, 2007.

Official communication issued in the counterpart Japanese Application No. 2003-406255, mailed on Jul. 17, 2007.

* cited by examiner

SURFACE ACOUSTIC WAVE FILTER AND COMMUNICATION APPARATUS

BACKGROUND OF THE INVENTION

1. Field of the Invention

The present invention relates to surface acoustic wave (SAW) filters having an improved transmission characteristic suitable for band-pass filters of communication apparatuses, such as portable phones, and to communication apparatuses including the same.

2. Description of the Related Art

In compact communication apparatuses such as portable phones, band-pass filters having a pass-band of several tens of MHz to several GHz have been commonly used. As an example of the band-pass filters, compact SAW filters have been used.

As shown in FIG. 25, a SAW filter 500 includes a filter element 504 having a reflector 510, interdigital transducers (IDTs) 501 to 503, and a reflector 511, which are arranged along a SAW-propagating direction on a piezoelectric substrate 100. Herein, each of the IDTs 501 to 503 provides an electric signal to a SAW coupling transducer including a pair of comb electrodes engaged with each other.

An input pad 520, an output pad 521, and ground pads 522 to 524 are disposed on the piezoelectric substrate 100, and wiring traces 525 to 530 for electrically connecting the IDTs 501 to 503 and the pads 520 to 524 are also disposed on the piezoelectric substrate 100.

All of the IDTs 501 to 503, the reflectors 510 and 511, the pads 520 to 524, and the wiring traces 525 to 530 are portions of a conductive thin-film pattern on the piezoelectric substrate 100.

When an electric signal is applied to the input pad 520 of the SAW filter 500, a surface acoustic wave (SAW) is excited by the IDTs 501 and 503, and a standing wave of the SAW is generated in a region including the IDTs 501 to 503 sandwiched by the reflectors 510 and 511. Then, the IDT 502 transforms the energy of the standing wave to an electric signal, such that an output potential is generated at the output pad 521. A transform characteristic of transforming an electric signal to a SAW by each of the IDTs 501 to 503 has a frequency characteristic, and thus, the SAW filter 500 has a band-pass characteristic.

The SAW filter 500 shown in FIG. 25 is a longitudinally coupled resonator SAW filter, in which the IDTs 501 and 503 for input and the IDT 502 for output are acoustically cascaded in an acoustic track sandwiched by the reflectors 510 and 511. In place of the longitudinally coupled resonator SAW filter, a transversely coupled resonator SAW filter, a transversal SAW filter, a ladder SAW filter, and a lattice SAW filter may be used.

In any type of SAW filters, a conductive thin-film pattern defining IDTs and wiring traces are disposed on a piezoelectric substrate, and a band-pass characteristic is obtained by using a frequency characteristic of an electric signal to SAW transform function of the IDTs.

Also, in known arts, at least portions of wiring traces are three-dimensionally crossed with each other such that an insulator including $SiO_2$ or other suitable material is provided therebetween, so as to miniaturize SAW filters (see Patent Documents 1 to 5):

Patent Document 1: Japanese Unexamined Patent Application Publication No. 5-167387 (Publication Date: Jul. 2, 1993);

Patent Document 2: Japanese Unexamined Patent Application Publication No. 5-235684 (Publication Date: Sep. 10, 1993);

Patent Document 3: Japanese Unexamined Patent Application Publication No. 7-30362 (Publication Date: Jan. 31, 1995);

Patent Document 4: Japanese Unexamined Patent Application Publication No. 2000-49567 (Publication Date: Feb. 18, 2000); and Patent Document 5: Japanese Unexamined Patent Application Publication No. 2000-138553 (Publication Date: May 16, 2000).

In the known SAW filters, a filter characteristic is deteriorated by parasitic capacitance generated between wiring traces on a piezoelectric substrate. Parasitic capacitance generated between a wiring trace receiving an input signal and a wiring trace generating an output signal serves as a current bypass from an input-signal terminal to an output-signal terminal. Therefore, the parasitic capacitance degrades the suppression level for signals of frequencies outside a pass band.

In particular, a SAW filter having many IDTs requires many wiring traces for connecting the IDTs. Further, the covered area is increased, parasitic capacitance is more likely to be generated, and the size of the filter is increased.

In a SAW filter having a balance-to-unbalance transformer function, in which one of input and output is an unbalanced signal and the other is a balanced signal, parasitic capacitance between a wiring trace receiving an unbalanced signal and a wiring trace receiving a balanced signal serves as a current path for bringing unbalanced signals of same phase and same amplitude to two balanced signals which usually must have opposite phases and the same amplitude. Therefore, a common-mode signal in each balanced signal increases, such that the degree of balance is deteriorated.

As described above, parasitic capacitance between wiring traces, in particular, parasitic capacitance between wiring traces having different potentials, has a detrimental effect on the characteristic of a SAW filter. Specifically, when a piezoelectric substrate includes a material having a relative permittivity of more than about 20, for example, $LiTaO_3$, $LiNbO_3$, or $Li_2B_4O_7$, parasitic capacitance substantially increases, and thus, the detrimental effects are significant. Also, larger current flows through the parasitic capacitance as the frequency increases. Therefore, a SAW filter having a higher-frequency pass band is more severely affected.

SUMMARY OF THE INVENTION

To overcome the problems described above, preferred embodiments of the present invention provide a SAW filter in which parasitic capacitance between wiring traces is reduced and the signal suppression level outside the pass band is increased. In addition, preferred embodiments of the present invention provide a SAW filter having an unbalance-to-balance transformer function in which a balanced signal has an improved degree of balance.

According to a preferred embodiment of the present invention, a SAW filter includes a piezoelectric substrate, an insulating pattern disposed on the piezoelectric substrate and having permittivity less than that of the piezoelectric substrate, and a conductor pattern disposed on at least one of the piezoelectric substrate and the insulating pattern. A portion of the conductor pattern defines IDTs and another portion thereof defines wiring traces. At a portion where wiring traces having different potentials face each other in a plan view, at least a portion of at least one of the wiring traces is disposed on the insulating pattern.

With this configuration, when a portion of the conductor pattern is disposed on the insulating pattern, the portion on the insulating pattern is not directly in contact with the piezoelectric substrate having a high permittivity and is held on the piezoelectric substrate through the insulating pattern having a lower permittivity than that of the piezoelectric substrate. Accordingly, parasitic capacitance between that portion and another portion of the conductor pattern is reduced by the insulating pattern. The parasitic capacitance increases as the permittivity of the piezoelectric substrate increases.

For example, when two conductor traces having a width of about 20 μm are arranged in parallel with an interval of about 20 μm on a LiTaO$_3$ substrate in a plan view, parasitic capacitance between the two conductor traces is reduced to about ½, as compared to a case where no insulating pattern is provided, by disposing one of the conductor traces on the insulating (resin) pattern having relative permittivity of about 2 and thickness of about 1 μm. Further, parasitic capacitance between the two conductor traces is reduced to about ⅓, as compared to a case where no insulating pattern is provided, by disposing both conductor traces on the insulating (resin) pattern having relative permittivity of about 2 and thickness of about 1 μm.

Further, in the above-described configuration, at a portion where wiring traces having different potentials face each other in a plan view, where parasitic capacitance is likely to be generated, at least a portion of at least one of the wiring traces is disposed on the insulating pattern. Accordingly, the parasitic capacitance is effectively reduced.

With this configuration, deterioration in transmission characteristics, for example, increase in insertion loss in the pass band and decrease in suppression level (attenuation) outside the pass band (particularly, in the high-frequency side) caused by the parasitic capacitance, is prevented. Accordingly, the transmission characteristics are greatly improved.

In the above-described SAW filter, the conductor pattern preferably includes a first conductor pattern disposed on the piezoelectric substrate, a portion thereof defining the IDTs, and a second conductor pattern which is in conduction with the first conductor pattern, a portion thereof being disposed on the insulating pattern.

In order to solve the above-described problems, according to another preferred embodiment of the present invention, a SAW filter includes a piezoelectric substrate, a first conductor pattern disposed on the piezoelectric substrate, a portion thereof defining IDTs and at least another portion thereof defining a first wiring pattern, an insulating pattern disposed on the piezoelectric substrate and on the first wiring pattern, and a second conductor pattern disposed on the piezoelectric substrate and on the insulating pattern and being in conduction with the first conductor pattern, at least a portion thereof defining a second wiring pattern. At a portion where wiring traces having different potentials face each other in a plan view in the first and second wiring patterns, at least portion of at least one of the wiring traces is disposed on the insulating pattern. The first wiring pattern crosses the second wiring pattern at at least one point, with the insulating pattern disposed therebetween.

With this configuration, the first wiring pattern crosses the second wiring pattern at at least one point, with the insulating pattern disposed therebetween. Herein, the first conductor pattern defines a lower-layer first wiring pattern, the insulating pattern having smaller permittivity than that of the piezoelectric substrate defines an interlayer insulating film, and the second conductor pattern defines an upper-layer second wiring pattern. By three-dimensionally crossing wiring traces of these patterns so as to arrange them on a single plane, space for the wiring traces (plane area in the thickness direction of the piezoelectric substrate) is reduced, and thus, the SAW filter is miniaturized.

Also, at a portion where wiring traces having different potentials face each other in a plan view in the first and second wiring patterns, at least a portion of at least one of the wiring traces is disposed on the insulating pattern. Accordingly, parasitic capacitance is more effectively reduced.

With this configuration, deterioration in transmission characteristics, for example, increase in insertion loss in the pass band and decrease in suppression level (attenuation) outside the pass band (particularly, in the high-frequency side) caused by the parasitic capacitance, is prevented. Accordingly, the transmission characteristics are greatly improved and the SAW filter is miniaturized.

Preferably, one of the wiring traces having different potentials receives an input signal and the other wiring trace receives an output signal.

In this configuration, when parasitic capacitance between the wiring trace for receiving an input signal and the wiring trace for receiving an output signal is reduced, current flowing from an input signal terminal to an output signal terminal through the parasitic capacitance is reduced. Accordingly, the signal suppression level outside the pass band of the SAW filter is increased.

In order to solve the above-described problems, according to another preferred of the present invention, a SAW filter including series-arm resonators and parallel-arm resonators arranged in a ladder pattern on a piezoelectric substrate is provided. The SAW filter includes the piezoelectric substrate, an insulating pattern disposed on the piezoelectric substrate and having permittivity less than that of the piezoelectric substrate, and a conductor pattern disposed on at least one of the piezoelectric substrate and the insulating pattern. A portion of the conductor pattern defines IDTs and another portion thereof defines wiring traces. At least a portion of the wiring traces is disposed on the insulating pattern.

In order to solve the above-described problems, according to another preferred embodiment of the present invention, a SAW filter including series-arm resonators and parallel-arm resonators arranged in a ladder pattern on a piezoelectric substrate is provided. The SAW filter includes the piezoelectric substrate, a first conductor pattern disposed on the piezoelectric substrate, a portion thereof defining IDTs and at least another portion thereof defining a first wiring pattern, an insulating pattern disposed on the piezoelectric substrate and on the first wiring pattern, and a second conductor pattern disposed on the piezoelectric substrate and on the insulating pattern and being in conduction with the first conductor pattern, at least a portion thereof defining a second wiring pattern. At a portion where wiring traces having different potentials face each other in a plan view in the first and second wiring patterns, at least a portion of at least one of the wiring traces is disposed on the insulating pattern. The first wiring pattern crosses the second wiring pattern at at least one point, with the insulating pattern disposed therebetween.

In this configuration, by providing the insulating pattern, deterioration in transmission characteristics, for example, increase in insertion loss in the pass band and decrease in suppression level (attenuation) outside the pass band (particularly, in the high-frequency side) caused by the parasitic capacitance, is prevented. Accordingly, the transmission characteristics are greatly improved and the SAW filter is miniaturized.

In the SAW filter, a portion of the second wiring pattern defines wiring traces for allowing ground pads to be directly in conduction, and the wiring traces preferably cross the first wiring pattern, with the insulating pattern disposed therebetween.

In the SAW filter, at least a portion of the wiring traces, in a portion except a portion for allowing the ground pads and the parallel-arm resonators to be in conduction, are preferably disposed on the insulating pattern.

The SAW filter preferably includes a multiple filter including a plurality of filter elements disposed on the piezoelectric substrate.

In order to solve the above-described problems, according to another preferred embodiment of the present invention, a SAW filter including series-arm resonators and lattice-arm resonators arranged in a lattice pattern on a piezoelectric substrate is provided. The SAW filter includes the piezoelectric substrate, an insulating pattern disposed on the piezoelectric substrate and having permittivity less than that of the piezoelectric substrate, and a conductor pattern disposed on at least one of the piezoelectric substrate and the insulating pattern. A portion of the conductor pattern defines IDTs and another portion thereof defines wiring traces. At least a portion of the wiring traces is disposed on the insulating pattern.

In this configuration, by providing the insulating pattern, deterioration in transmission characteristics, for example, increase in insertion loss in the pass band and decrease in suppression level (attenuation) outside the pass band (particularly, in the high-frequency side) caused by the parasitic capacitance, is prevented. Accordingly, the transmission characteristics are greatly improved and the SAW filter is miniaturized.

Preferably, the relative permittivity of the insulating pattern is less than about 4. With this configuration, by increasing the difference in relative permittivity of the insulating pattern and the piezoelectric substrate, the parasitic capacitance is further reduced, and thus, the transmission characteristics are further improved.

Preferably, the insulating pattern includes resin. With this configuration, the relative permittivity of the insulating pattern is reduced to about 2, and the difference in relative permittivity of the insulating pattern and the piezoelectric substrate is increased. Accordingly, the parasitic capacitance is further reduced, and thus, the transmission characteristics are further improved.

The insulating pattern is easily formed, for example, by forming a resin layer on the piezoelectric substrate by spin-coating or spraying a photosensitive liquid resin or bonding a resin sheet, and then by performing patterning using photolithography. Alternatively, the insulating pattern can be easily formed by using screen printing or other suitable method.

By using resin, the insulating pattern is easily formed. Further, by using resin, an insulating pattern having a thickness of at least about 1 µm is formed with relative ease.

The following problems occur when an insulating pattern is formed by using a ceramic material. In order to form a thin-film pattern (insulating pattern) by using a ceramic material, a lift-off method or etching may be adopted.

When a thin-film pattern including a ceramic material is formed by a lift-off method, a ceramic film must be formed by depositing particles substantially vertically to a deposition surface. However, the melting point of a ceramic material is generally high, and thus vacuum evaporation, which is a typical method for depositing particles substantially vertically to a deposition surface, is not preferable. Therefore, there is no other choice but to use a special high-cost deposition method, such as sputtering deposition using a collimator.

When a thin-film pattern including a ceramic material is formed by etching, etching of the ceramic material must be performed while protecting the surface of the piezoelectric substrate defining a path of SAW against damage, but this is very difficult. When etching of a ceramic material is performed, the surface of the piezoelectric substrate is damaged, and thus, the characteristics of the SAW filter are deteriorated.

As described above, it is difficult to form a thin-film pattern (insulating pattern) including a ceramic material on a piezoelectric substrate at low cost. Even if a thin-film pattern (insulating pattern) including a ceramic material can be formed on a piezoelectric substrate, the thickness thereof is a maximum of several hundreds of nm. Also, the relative permittivity of a ceramic material is usually at least about 4. Therefore, it is difficult to reduce parasitic capacitance between conductor traces, in particular, between conductor traces at a crossing portion.

In the above-described configuration, however, the insulating pattern includes resin. The interlayer insulating film has a permittivity of less than about 4, for example, about 2, and the thickness thereof is about 1 µm or more. With this configuration, parasitic capacitance between conductor traces at a crossing portion does not adversely affect the characteristics of the SAW filter.

In the SAW filter, the relative permittivity of the piezoelectric substrate is preferably about 20 or more. Also, the piezoelectric substrate preferably includes any of $LiTaO_3$, $LiNbO_3$, and $Li_2B_4O_7$. With this configuration, the difference in the relative permittivity of the insulating pattern and the piezoelectric substrate comprising any of $LiTaO_3$, $LiNbO_3$, and $Li_2B_4O_7$, having a relative permittivity of about 20 or more, is increased. Accordingly, the parasitic capacitance is more effectively reduced and the transmission characteristics are further improved.

In the SAW filter, the center frequency in the pass band is preferably 500 MHz or more. Alternatively, the center frequency in the pass band may be about 1 GHz or more.

In the above-described configuration, as the center frequency in the used pass band increases, current flowing through parasitic capacitance increases. In particular, when the center frequency in the pass band is about 500 MHz or more, especially about 1 GHz or more, current flowing through parasitic capacitance increases, and its effect increases. Therefore, by using the above-described configuration in a SAW filter having the center frequency in the pass band, parasitic capacitance is reduced and current flowing through the parasitic capacitance is significantly reduced.

Preferably, the thickness of the insulating pattern is about 0.5 µm or more. By setting the thickness of the insulating pattern to about 0.5 µm or more, parasitic capacitance is further reduced, and thus the transmission characteristics are further improved.

In the SAW filter, the IDTs preferably have a balance-to-unbalance transformer function.

In the above-described configuration, the SAW filter has an unbalanced signal-to-balanced signal transformer function, in which one of input and output signals is an unbalanced signal and the other signal is a balanced signal. In this SAW filter, when parasitic capacitance between a wiring trace for receiving an unbalanced signal and a wiring trace for receiving a balanced signal is reduced, current flowing from an unbalanced signal terminal to a balanced signal terminal through parasitic capacitance reduces. Accordingly, a common-mode signal suppression level increases and the degree of balance of the balanced signal is greatly improved.

A communication apparatus of another preferred embodiment of the present invention includes a SAW filter according to any of the preferred embodiments described above. With this configuration, the communication apparatus has outstanding transmission characteristics and is miniaturized.

As described above, the SAW filter of various preferred embodiments of the present invention includes the insulating pattern disposed on the piezoelectric substrate and having permittivity less than that of the piezoelectric substrate, and the conductor pattern disposed on at least one of the piezoelectric substrate and the insulating pattern. A portion of the conductor pattern defines IDTs and another portion thereof defines wiring traces, and at a portion where wiring traces having different potentials face each other in a plan view, at least a portion of at least one of the wiring traces is disposed on the insulating pattern.

In this configuration, at least a portion of the conductor pattern is disposed on the insulating pattern, which has a permittivity less than that of the piezoelectric substrate. Therefore, at that portion, the insulating pattern is disposed between the piezoelectric substrate and the conductor pattern.

With this configuration, parasitic capacitance between at least a portion of the conductor pattern and another portion of the conductor pattern is reduced by providing the insulating pattern. Accordingly, transmission characteristics (insertion loss in the pass band, suppression level outside the pass band, etc.) depending on the parasitic capacitance are effectively improved.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Hereinafter, preferred embodiments of the present invention will be described with reference to FIGS. 1 to 24.

First Preferred Embodiment

Figure 1:
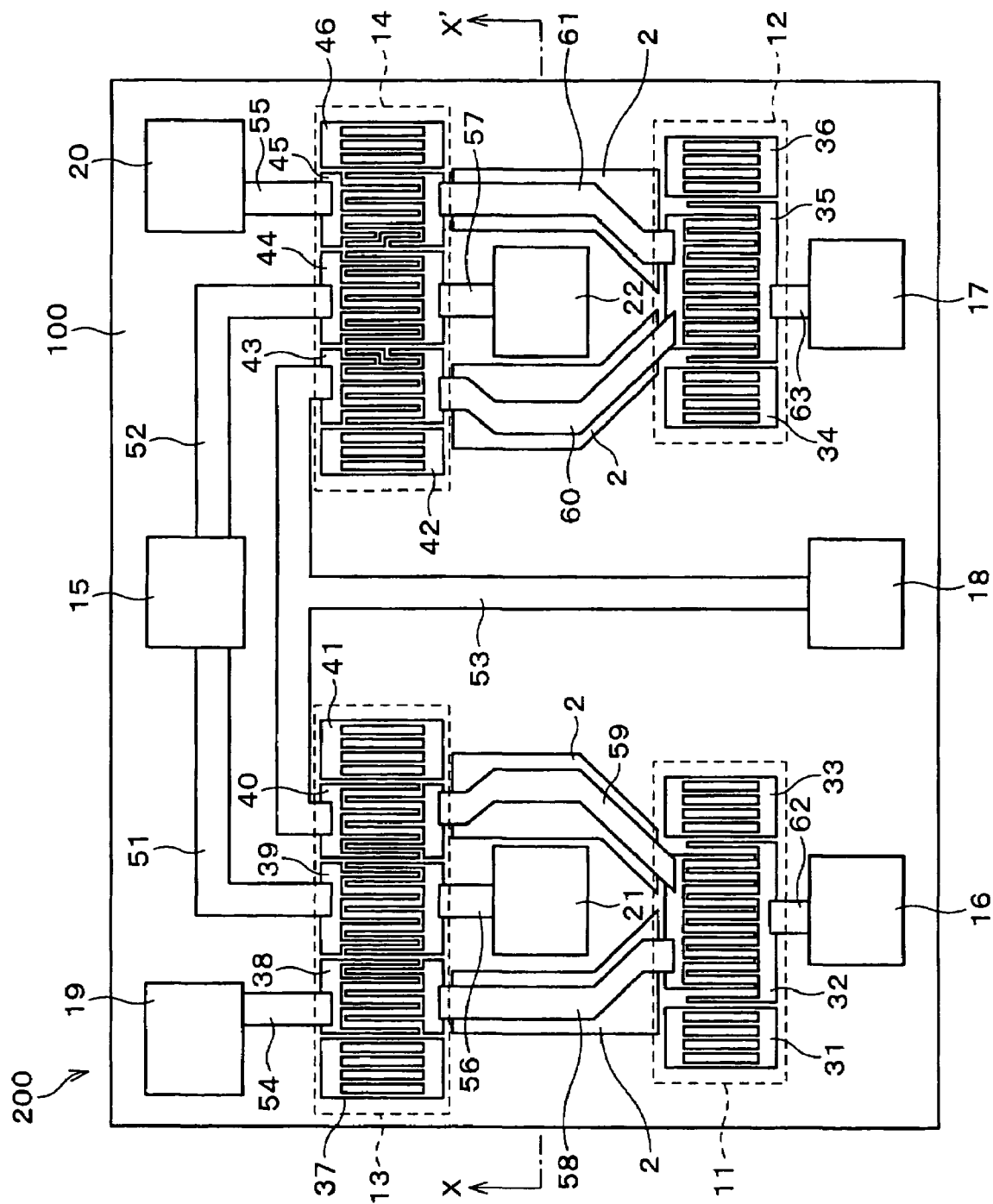
FIG. 1 is a plan view of a SAW filter according to a first preferred embodiment of the present invention.
Figure 2:
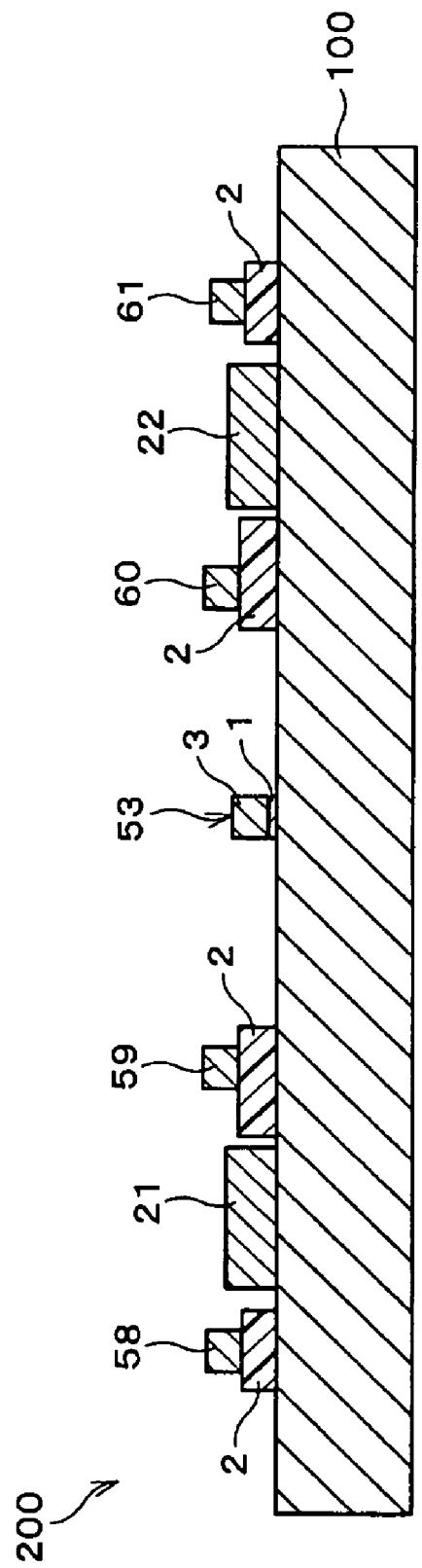
FIG. 2 is a cross-sectional view taken along the line X-X' in FIG. 1.

As shown in FIGS. 1 and 2, a surface acoustic wave (SAW) filter 200 according to a first preferred embodiment includes a first conductor pattern 1, a resin pattern (insulating pattern) 2, and a second conductor pattern 3, which are arranged on a piezoelectric substrate 100. In a direction vertical to the plane of FIG. 1, the piezoelectric substrate 100 is at the lowermost position, and the first conductor pattern 1, the resin pattern 2, and the second conductor pattern 3 are disposed in this order. The piezoelectric substrate 100 is a 38.5° rotated Y-cut X-propagation LiTaO$_3$ single crystal.

The first conductor pattern 1 includes an aluminum thin-film which is about 200 nm thick. The resin pattern 2 includes a polyimide film which is about 1 μm thick. The second conductor pattern 3 includes two layers of conductive thin-films, in which the lower layer is a nichrome thin-film which is about 200 nm thick and the upper layer is an aluminum thin-film which is about 1000 nm thick.

The first conductor pattern 1 defines one-terminal-pair SAW resonators 11 and 12 and longitudinally coupled resonator SAW filters 13 and 14. The one-terminal-pair SAW resonator 11 includes a grating reflector 31, an interdigital transducer (IDT) 32, and a grating reflector 33, which are arranged along the SAW propagation direction. Likewise, the one-terminal-pair SAW resonator 12 includes a grating reflector 34, an IDT 35, and a grating reflector 36, which are arranged along the SAW propagation direction.

The one-terminal-pair SAW resonators 11 and 12 have the same configuration. In specific design parameters thereof, each of the IDTs 32 and 35 and the grating reflectors 31, 33, 34, and 36 has a pitch of about 1.06 µm, and the metallization ratio thereof is about 0.6. Also, the distance between the IDT and the grating reflector (distance between centers of adjoining electrode fingers) is about 1.06 µm. The interdigital width of electrode fingers of the IDTs 32 and 35 is about 74 µm. The number of electrode fingers in each of the IDTs 32 and 35 is 241, and the number of electrode fingers in each of the grating reflectors 31, 33, 34, and 36 is 30. In FIG. 1, a smaller number of electrode fingers are shown.

The longitudinally coupled resonator SAW filter 13 includes a grating reflector 37, IDTs 38 to 40, and a grating reflector 41, which are arranged along the SAW propagation direction, and the longitudinally coupled resonator SAW filter 14 includes a grating reflector 42, IDTs 43 to 45, and a grating reflector 46, which are arranged along the SAW propagation direction.

In design parameters of the longitudinally coupled resonator SAW filter 13, each of the grating reflectors 37 and 41 has a pitch of about 1.09 µm, and the metallization ratio thereof is about 0.57. Also, each of the IDTs 38 to 40 has a pitch of about 1.08 µm, and the metallization ratio thereof is about 0.72.

In each of the IDTs 38 to 40, however, three electrode fingers at the edge facing an adjoining IDT has a pitch of about 0.96 µm, and the metallization ratio thereof is about 0.68. The distance between the IDT and the grating reflector (distance between centers of adjoining electrode fingers) is about 1.02 µm. The distance between adjoining IDTs (distance between centers of adjoining electrode fingers) is about 0.96 µm. The interdigital width of electrode fingers of the IDTs 38 to 40 is about 90 µm. The number of electrode fingers in each of the grating reflectors 37 and 41 is 90, the number of electrode fingers in each of the IDTs 38 and 40 is 21, and the number of electrode fingers in the IDT 39 is 39. Although a smaller number of electrode fingers are shown in FIG. 1, the polarity of each electrode finger facing an adjoining IDT or grating reflector is precisely illustrated.

In design parameters of the longitudinally coupled resonator SAW filter 14, each of the grating reflectors 42 and 46 has a pitch of about 1.09 µm, and the metallization ratio thereof is about 0.57. Also, each of the IDTs 43 to 45 has a pitch of about 1.08 µm, and the metallization ratio thereof is about 0.72.

In each of the IDTs 43 to 45, however, three electrode fingers at the edge facing an adjoining IDT has a pitch of about 0.96 µm, and the metallization ratio thereof is about 0.68. The distance between the IDT and the grating reflector (distance between centers of adjoining electrode fingers) is about 1.02 µm. The distance between adjoining IDTs (distance between centers of adjoining electrode fingers) is about 0.96 µm. The interdigital width of electrode fingers of the IDTs 43 to 45 is about 90 µm. The number of electrode fingers in each of the grating reflectors 42 and 46 is 60, the number of electrode fingers in each of the IDTs 43 and 45 is 21, and the number of electrode fingers in the IDT 44 is 39. Although a smaller number of electrode fingers are shown in FIG. 1, the polarity of each electrode finger facing an adjoining IDT or grating reflector is precisely illustrated.

In the IDTs 43 and 45, portions facing the IDT 44 are weighted in series. That is, in each of the IDTs 43 and 45, the length of two electrode fingers adjoining the IDT 44 is set to about ½, a dummy electrode finger is provided at each of two electrode-finger lacking portions, and the two dummy electrode fingers are connected.

The longitudinally coupled resonator SAW filters 13 and 14 have almost the same design. However, the polarity of the IDTs 38 and 40 is opposite to that of the IDTs 43 and 45. Therefore, when receiving the same input signal, the longitudinally coupled resonator SAW filters 13 and 14 generate signals of almost the same amplitude and opposite phases.

The second conductor pattern 3 defines an input pad 15, a first output pad 16, a second output pad 17, ground pads 18 to 22, and wiring traces 51 to 63.

The wiring trace 51 enables the input pad 15 and the IDT 39 to be electrically continuous. The wiring trace 52 enables the input pad 15 and the IDT 44 to be electrically continuous. The wiring trace 53 enables the ground pad 18 and the IDTs 40 and 43 to be electrically continuous.

The wiring trace 54 enables the ground pad 19 and the IDT 38 to be electrically continuous. The wiring trace 55 enables the ground pad 20 and the IDT 45 to be electrically continuous. The wiring trace 56 enables the ground pad 21 and the IDT 39 to be electrically continuous. The wiring trace 57 enables the ground pad 22 and the IDT 44 to be electrically continuous.

The wiring trace 58 enables the IDTs 38 and 32 to be electrically continuous. The wiring trace 59 enables the IDTs 40 and 32 to be electrically continuous. The wiring trace 60 enables the IDTs 43 and 35 to be electrically continuous. The wiring trace 61 enables the IDTs 45 and 35 to be electrically continuous.

The wiring trace 62 enables the IDT 32 and the first output pad 16 to be electrically continuous, and the wiring trace 63 enables the IDT 35 and the second output pad 17 to be electrically continuous.

Herein, portions of the wiring traces 58 to 61 are disposed on the resin pattern 2, and at those portions, the piezoelectric substrate 100 and the wiring traces 58 to 61 are not directly in contact with each other. That is, they are separated from each other.

The portions of the wiring traces 58 and 59 on the resin pattern 2, and the wiring trace 56 and the ground pad 21 define conductor traces having different potentials and facing each other in a plan view. This is the same for the wiring traces 60 and 61, and the wiring trace 57 and the ground pad 22.

A method for manufacturing the SAW filter 200 is not specified. For example, the first conductor pattern 1 may be formed on the piezoelectric substrate 100 by vacuum deposition and etching by using a photoresist pattern as a mask, then the resin pattern 2 may be formed, and then the second conductor pattern 3 may be formed by vacuum deposition and a lift-off method.

A method for forming the resin pattern 2 is not specified either. For example, monomers to be polymerized so as to generate polyimide when exposed to ultraviolet rays are dispersed in a solvent. Then, the liquid is applied by spin coating, the solvent is volatilized by baking it so as to reduce its flowability, and then ultraviolet rays are radiated thereto through a photo mask for shielding a portion except the portion to be the resin pattern 2. Accordingly, polyimide is generated at the portion serving as the resin pattern 2. Then, a development process is performed by using a chemical solution for removing the remaining monomers, such that the resin pattern 2 including polyimide is formed.

Next, the operation of the SAW filter 200 will be described. When an input signal is applied to the input pad 15, the input signal is applied to the IDT 39 of the longitudinally coupled resonator SAW filter 13, and an output signal is generated in the IDTs 38 and 40. The generated output signal is transmitted to the first output pad 16 through the one-terminal-pair SAW resonator 11.

At the same time, when the input signal is applied to the input pad 15, the input signal is applied to the IDT 44 of the longitudinally coupled resonator SAW filter 14, and an output signal is generated in the IDTs 43 and 45. The generated output signal is transmitted to the second output pad 17 through the one-terminal-pair SAW resonator 12.

The output signal generated by the longitudinally coupled resonator SAW filter 13 and the output signal generated by the longitudinally coupled resonator SAW filter 14 have approximately the same amplitude and opposite phases. Therefore, the SAW filter 200 has an unbalance-to-balance transformer function, in which a balanced signal is generated in each of the first and second output pads 16 and 17 by applying an unbalanced signal to the input pad 15.

The band-pass characteristics of the SAW filter 200 are substantially achieved by the longitudinally coupled resonator SAW filters 13 and 14. Each of the one-terminal-pair SAW resonators 11 and 12 is designed so as to have an antiresonance frequency in a cut-off region in the high-frequency side of the SAW filter 200, and functions so as to improve signal suppression in the cut-off region in the high-frequency side of the SAW filter 200.

In each of the longitudinally coupled resonator SAW filters 13 and 14, output impedance may be capacitively shifted in the high-frequency side in the pass band, and thus, impedance matching is deteriorated. However, each of the one-terminal-pair SAW resonators 11 and 12 is designed so as to have inductive impedance in its frequency region, and functions so as to improve impedance matching in the frequency region.

Herein, portions of the wiring traces 58 to 61, to which outputs of the longitudinally coupled resonator SAW filters 13 and 14 are applied, are disposed on the resin pattern 2. At those portions, the piezoelectric substrate 100 is not directly in contact with the wiring traces 58 to 61.

Accordingly, parasitic capacitance between input and output units of the longitudinally coupled resonator SAW filter 13 is less than a case where the resin pattern 2 is not provided. That is, less current flows from the input unit to the output unit of the longitudinally coupled resonator SAW filter 13 through the parasitic capacitance.

Likewise, parasitic capacitance between input and output units of the longitudinally coupled resonator SAW filter 14 is less than a case where the resin pattern 2 is not provided. That is, less current flows from the input unit to the output unit of the longitudinally coupled resonator SAW filter 14 through the parasitic capacitance.

By providing the resin pattern 2, less current flows from the input unit to the output unit of the longitudinally coupled resonator SAW filter 13 through the parasitic capacitance, and at the same time, less current flows from the input unit to the output unit of the longitudinally coupled resonator SAW filter 14 through the parasitic capacitance. Accordingly, signal suppression outside the pass band of the SAW filter 200 is improved and also common-mode signal suppression is improved, such that the degree of balance of a balanced signal is increased.

Another advantage is obtained by disposing portions of the wiring traces 58 to 61 on the resin pattern 2.

Each of the one-terminal-pair SAW resonators 11 and 12 is designed so as to have inductive impedance in the high-frequency side of the pass band. Therefore, if the resin pattern 2 is not provided, parallel resonance occurs and large current flows between the one-terminal-pair SAW resonators 11 and 12 including inductive impedance and ground capacitance of the wiring traces 58 to 61 in the high-frequency side of the pass band, such that energy loss is caused by heat due to ohmic resistance. The energy loss caused by the heat increases insertion loss in the pass band.

In various preferred embodiments of the present invention, the ground capacitance of the wiring traces 58 to 61 decreases by disposing portions of the wiring traces 58 to 61 on the resin pattern 2. Therefore, the amount of current flowing between the one-terminal-pair SAW resonators 11 and 12 and the wiring traces 58 to 61 reduces, and thus, insertion loss in the pass band is reduced.

In the SAW filter 200 of the first preferred embodiment, only portions of the wiring traces 58 to 61 are on the resin pattern 2. Alternatively, portions of all the wiring traces may be disposed on the resin pattern 2.

However, grounded wiring traces are preferably not disposed on the resin pattern and the potential of the piezoelectric substrate 100 is maintained at the ground potential. Further, wiring traces, to which a high-frequency signal is applied, having a different potential from that of the grounded wiring traces are preferably disposed on the resin pattern so as to reduce parasitic capacitance between the wiring traces and other wiring traces. Accordingly, the degree of balance of a balanced signal is effectively increased. The use of the resin pattern is also effective in other preferred embodiments which will be described below.

Figure 3:
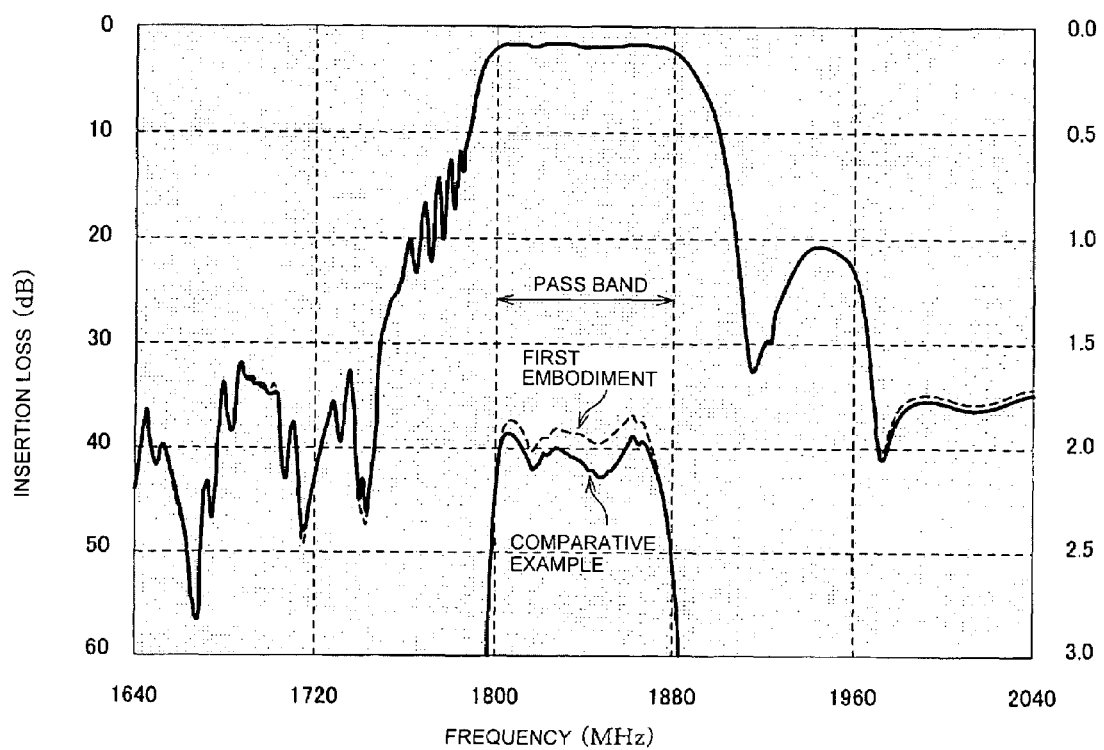
FIG. 3 is a graph showing transmission characteristics in the first preferred embodiment and a comparative example.
Figure 4:
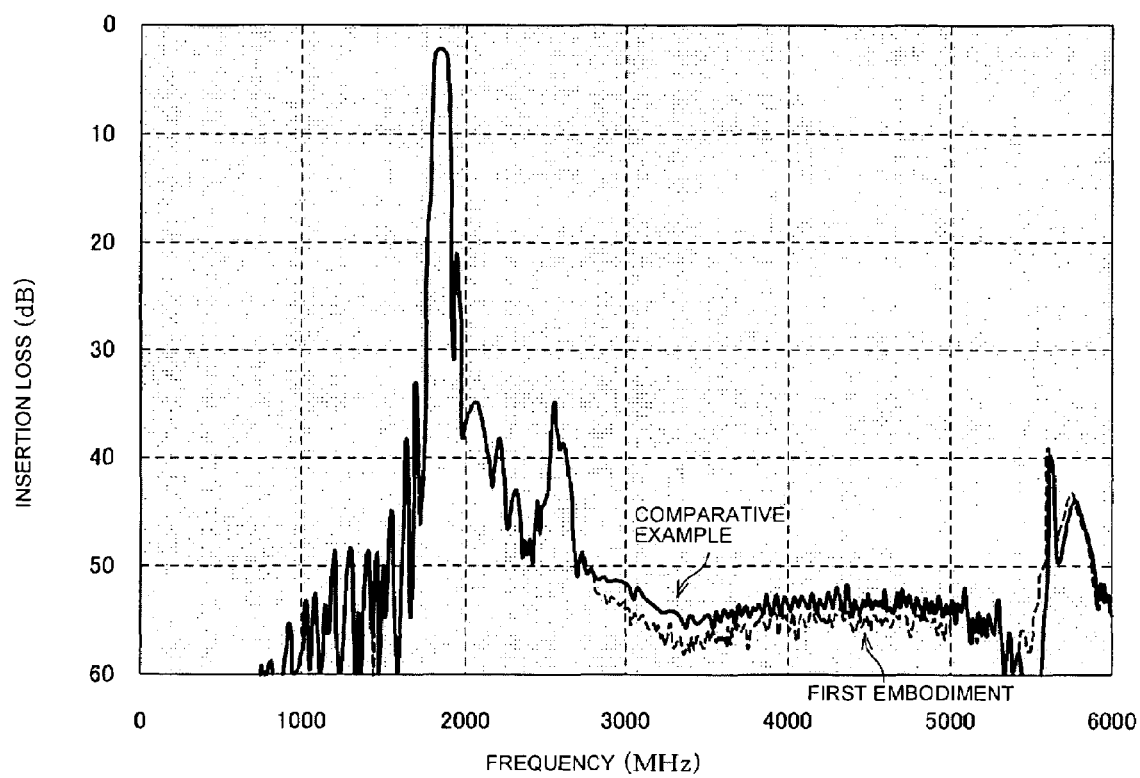
FIG. 4 is a graph showing the transmission characteristics in the first preferred embodiment and the comparative example in a higher-frequency band.
Figure 5:
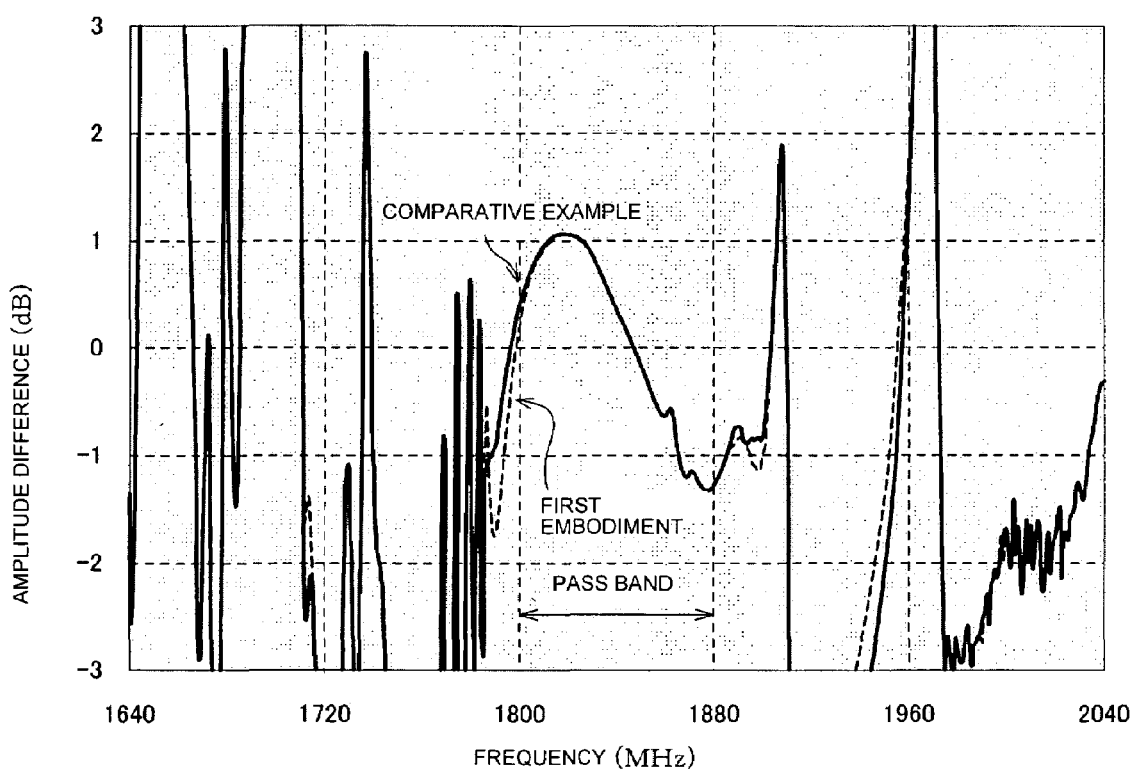
FIG. 5 is a graph showing the degree of balance in amplitude of a balanced signal in each of the first preferred embodiment and the comparative example.
Figure 6:
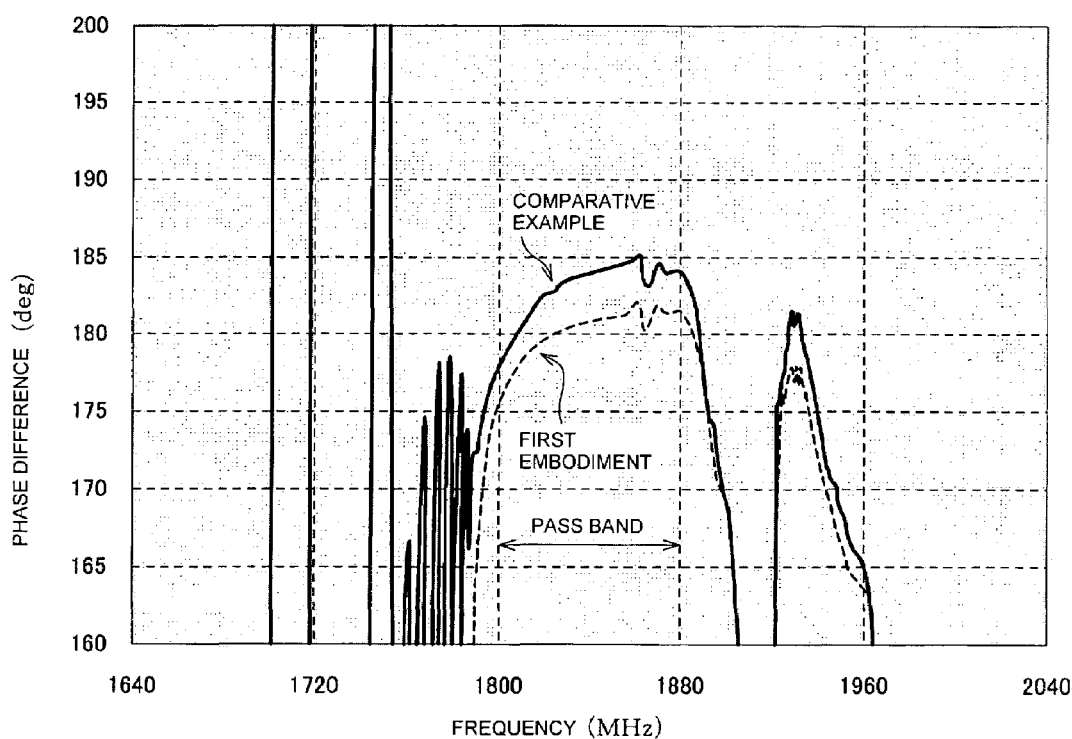
FIG. 6 is a graph showing the degree of balance in phase of the balanced signal in each of the first preferred embodiment and the comparative example.
Figure 7:
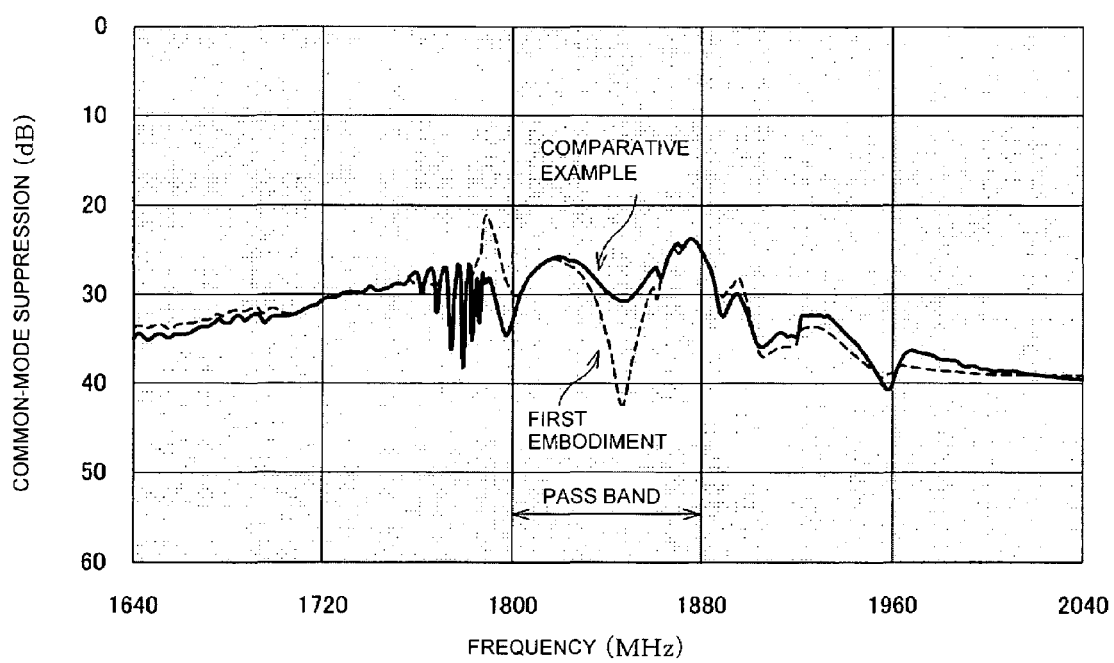
FIG. 7 is a graph showing common-mode suppression in each of the first preferred embodiment and the comparative example.

FIGS. 3 and 4 show transmission characteristics of the SAW filter 200 and a SAW filter according to a comparative example. Also, FIGS. 5 and 6 show the degree of balance in amplitude and phase of a balanced signal in each of the SAW filter 200 and the SAW filter of the comparative example. FIG. 7 shows common-mode suppression in the SAW filter 200 and the SAW filter of the comparative example. The SAW filter of the comparative example used in FIGS. 3 to 7 has the same configuration as that of the SAW filter 200 except that the resin pattern 2 is not provided therein.

As shown in FIG. 3, insertion loss in the pass band in the first preferred embodiment is less than that in the comparative example, especially in the high-frequency side. Also, as shown in FIG. 4, insertion loss (signal suppression level) is higher in a high-frequency region of about 3000 to about 5000 MHz outside the pass band in the first preferred embodiment, as compared to the comparative example.

As shown in FIG. 5, regarding the amplitude difference in a balanced signal in the pass band, no significant difference exists between the first preferred embodiment and the comparative example. However, as is clear from FIG. 6, the phase difference in the balanced signal in the pass band is closer to 180° (opposite phase) and the phase is well balanced in the first preferred embodiment, as compared to the comparative example. Also, as shown in FIG. 7, common-mode in the pass band is suppressed more effectively in the first preferred embodiment than in the comparative example. Accordingly, as shown in FIGS. 5 and 6, the degree of balance of the balanced signal is improved in the first preferred embodiment as compared to the comparative example.

Second Preferred Embodiment

Figure 8:
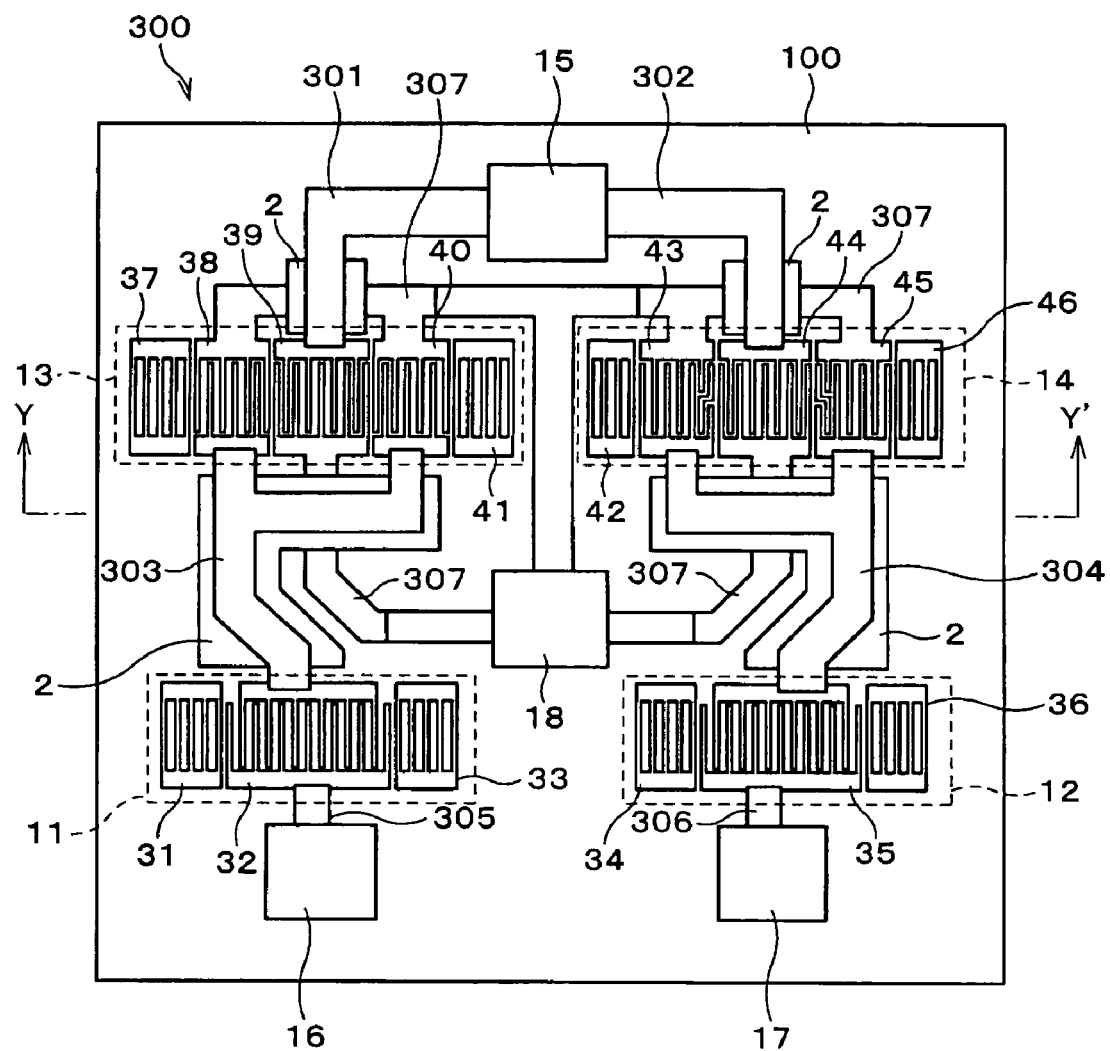
FIG. 8 is a plan view of a SAW filter according to a second preferred embodiment of the present invention.
Figure 9:
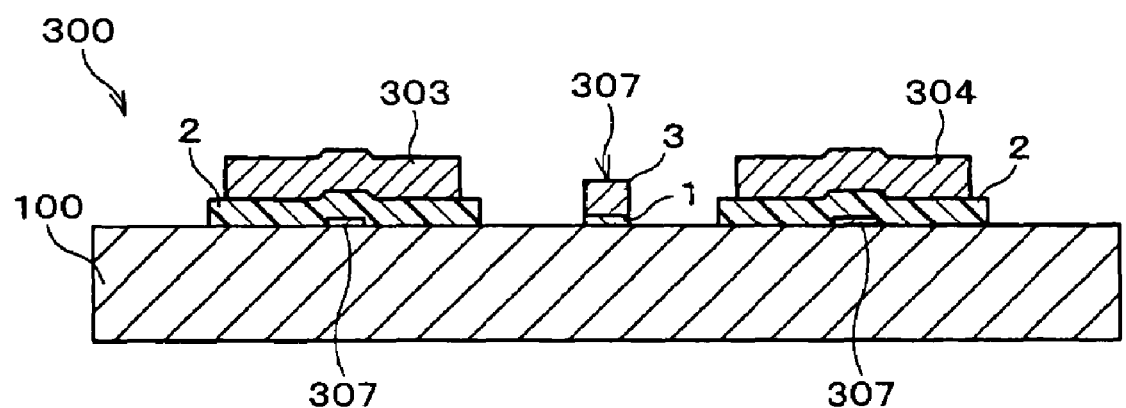
FIG. 9 is a cross-sectional view taken along the line Y-Y' in FIG. 8.

FIG. 8 shows a SAW filter 300 according to a second preferred embodiment. FIG. 9 is a cross-sectional view taken along the line Y-Y' in FIG. 8. In the SAW filter 300 shown in FIG. 8, portions denoted by the same reference numerals as in FIG. 1 have the same function as that in the SAW filter 200. The differences between the SAW filters 300 and 200 are the shape of the resin pattern 2 and the wiring traces. Hereinafter, the different parts will be described.

A wiring trace 301 is a portion of the second conductor pattern 3 and enables the input pad 15 and the IDT 39 to be electrically continuous. A wiring trace 302 is a portion of the second conductor pattern 3 and enables the input pad 15 and the IDT 44 to be electrically continuous.

A wiring trace 303 is a portion of the second conductor pattern 3 and enables the IDTs 38 and 32 and the IDTs 40 and 32 to be electrically continuous. A wiring trace 304 is a portion of the second conductor pattern 3 and enables the IDTs 43 and 35 and the IDTs 45 and 35 to be electrically continuous.

A wiring trace 305 is a portion of the second conductor pattern 3 and enables the IDT 32 and the first output pad 16 to be electrically continuous. A wiring trace 306 is a portion of the second conductor pattern 3 and enables the IDT 35 and the second output pad 17 to be electrically continuous.

A wiring trace 307 is a portion of the first conductor pattern 1 and enables the IDT 38 and the ground pad 18, the IDT 39 and the ground pad 18, the IDT 40 and the ground pad 18, the IDT 43 and the ground pad 18, the IDT 44 and the ground pad 18, and the IDT 45 and the ground pad 18 to be electrically continuous.

The wiring trace 307 is three-dimensionally crossed with the wiring traces 301 to 304. At the crossing portions, the wiring trace 307 defines a lower-layer wiring formed by the first conductor pattern 1, the resin pattern 2 defines an interlayer insulating film, and the wiring traces 301 to 304 define an upper-layer wiring formed by the second conductor pattern 3. At the crossing portions, the wiring trace 307 and the wiring traces 301 to 304 sandwich the resin pattern 2 so as to be crossed with each other without being in conduction to each other. A portion of the wiring trace 307 is covered by the second conductor pattern 3, but at the crossing portions of the wiring trace 307 and the wiring traces 301 to 304, the wiring trace 307 defines a single-layer wiring trace formed by the first conductor pattern 1.

Miniaturization of the SAW filter 300 is achieved by three-dimensionally crossing the wiring traces. Also, the length of each wiring trace for transmitting a signal is reduced, and thus, insertion loss is effectively reduced.

Additionally, in the SAW filter 300, by providing the resin pattern 2, short-circuiting at crossing portions is prevented. Also, parasitic capacitance between wiring traces of different potentials which face each other (particularly, close to each other) in the direction of the surface of the piezoelectric substrate 100, for example, between the wiring traces 303 and 307 and between the wiring traces 304 and 307, is reduced. Accordingly, insertion loss in the pass band is reduced and the suppression level outside the pass band (particularly, in the high-frequency side) is increased.

Third Preferred Embodiment

Figure 10:
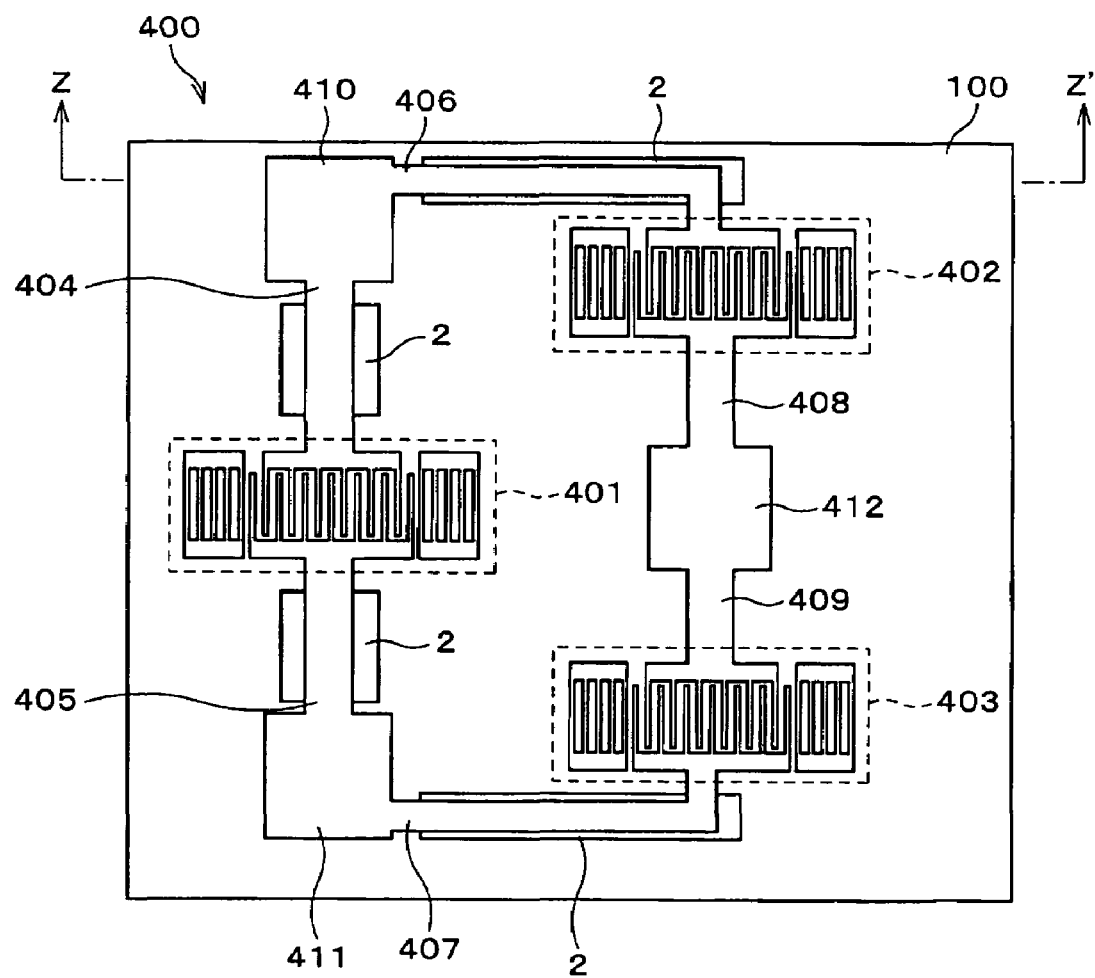
FIG. 10 is a plan view of a SAW filter according to a third preferred embodiment of the present invention.
Figure 11:
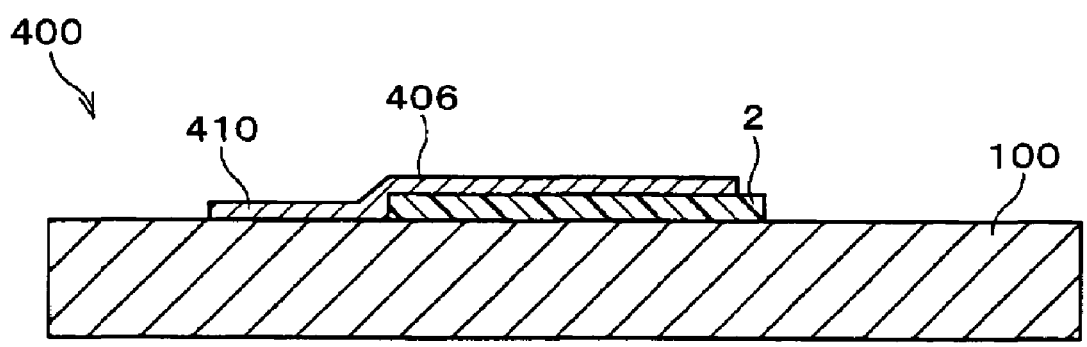
FIG. 11 is a cross-sectional view taken along the line Z-Z' in FIG. 10.

FIG. 10 shows a SAW filter 400 according to a third preferred embodiment. FIG. 11 is a cross-sectional view taken along the line Z-Z' in FIG. 10. The SAW filter 400 is a ladder band-pass filter including three one-terminal-pair SAW resonators 401 to 403 connected in a ladder pattern. The specific operating principles of the ladder filter are known, and thus, they are not described here.

All of the one-terminal-pair SAW resonators 401 to 403, wiring traces 404 to 409, an input pad 410, an output pad 411, and a ground pad 412 are part of the first conductor pattern 1 disposed on the piezoelectric substrate 100. The one-terminal-pair SAW resonators 401 to 403 are arranged such that the SAW propagation directions thereof are substantially parallel to each other.

Portions of the wiring traces 404 to 407 at the positions facing each other in a plan view are disposed on the resin pattern 2. A method for manufacturing the SAW filter 400 is not specified. For example, the resin pattern 2 is formed on the piezoelectric substrate 100, a conductive thin-film is formed on the entire surface by vacuum evaporation, and then the conductive thin-film is patterned by dry etching so as to form the first conductor pattern 1.

In the SAW filter 400, the resin pattern 2 is provided between at least portions of the wiring traces 404 to 407 and the piezoelectric substrate 100 at the positions where the wiring traces 404 to 407 face each other in a plan view. With this configuration, parasitic capacitance between the wiring traces 404 and 405, between the wiring traces 406 and 408, and between the wiring traces 407 and 409 is reduced. Accordingly, insertion loss in the pass band is reduced and the suppression level outside the pass band (particularly, in the high-frequency side) is increased.

Figure 12:
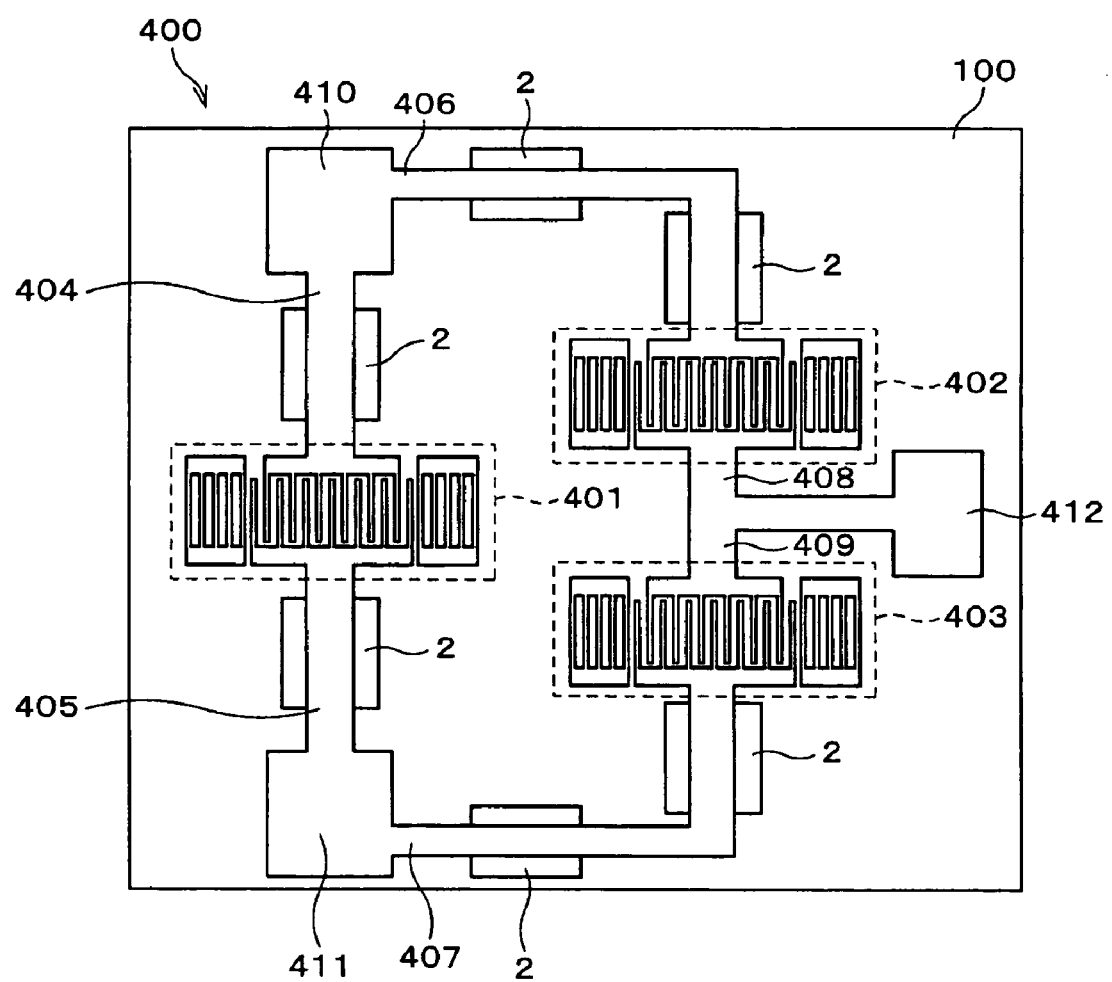
FIG. 12 is a plan view of a SAW filter according to a modification of the third preferred embodiment of the present invention.
Figure 13:
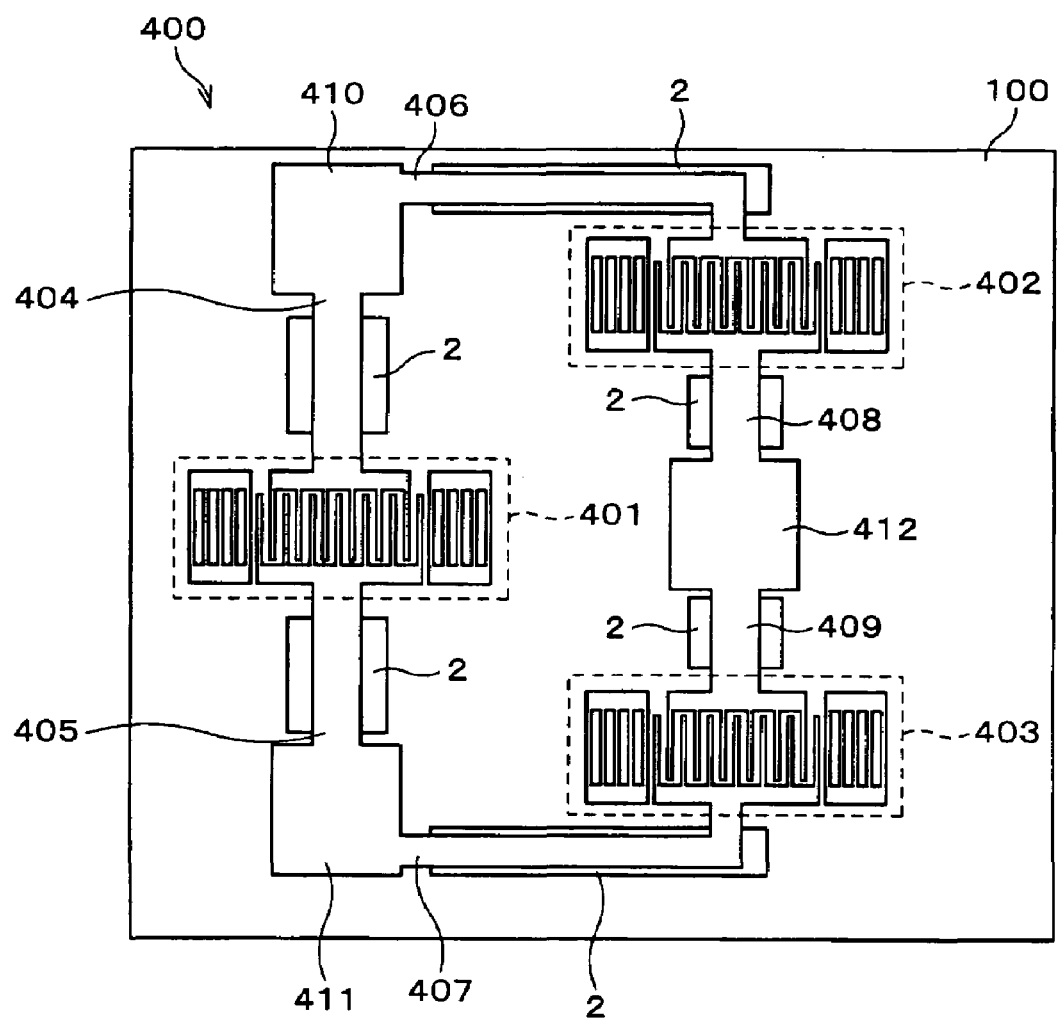
FIG. 13 is a plan view of a SAW filter according to another modification of the third preferred embodiment of the present invention.

FIGS. 12 and 13 show modifications of the third preferred embodiment. In the modifications, another resin pattern 2 is provided under the wiring trace 406 or 408 at the position facing the resin pattern 2 under the wiring trace 404 in a plan view, and still another resin pattern 2 is provided under the wiring trace 407 or 409 at the position facing the resin pattern 2 under the wiring trace 405 in a plan view.

In each of the modifications, parasitic capacitance between the wiring traces 404 and 405, between the wiring traces 406 and 408, and between the wiring traces 407 and 409 is further reduced. Accordingly, insertion loss in the pass band is further reduced and the suppression level outside the pass band (particularly, in the high-frequency side) is further increased.

Fourth Preferred Embodiment

Figure 14:
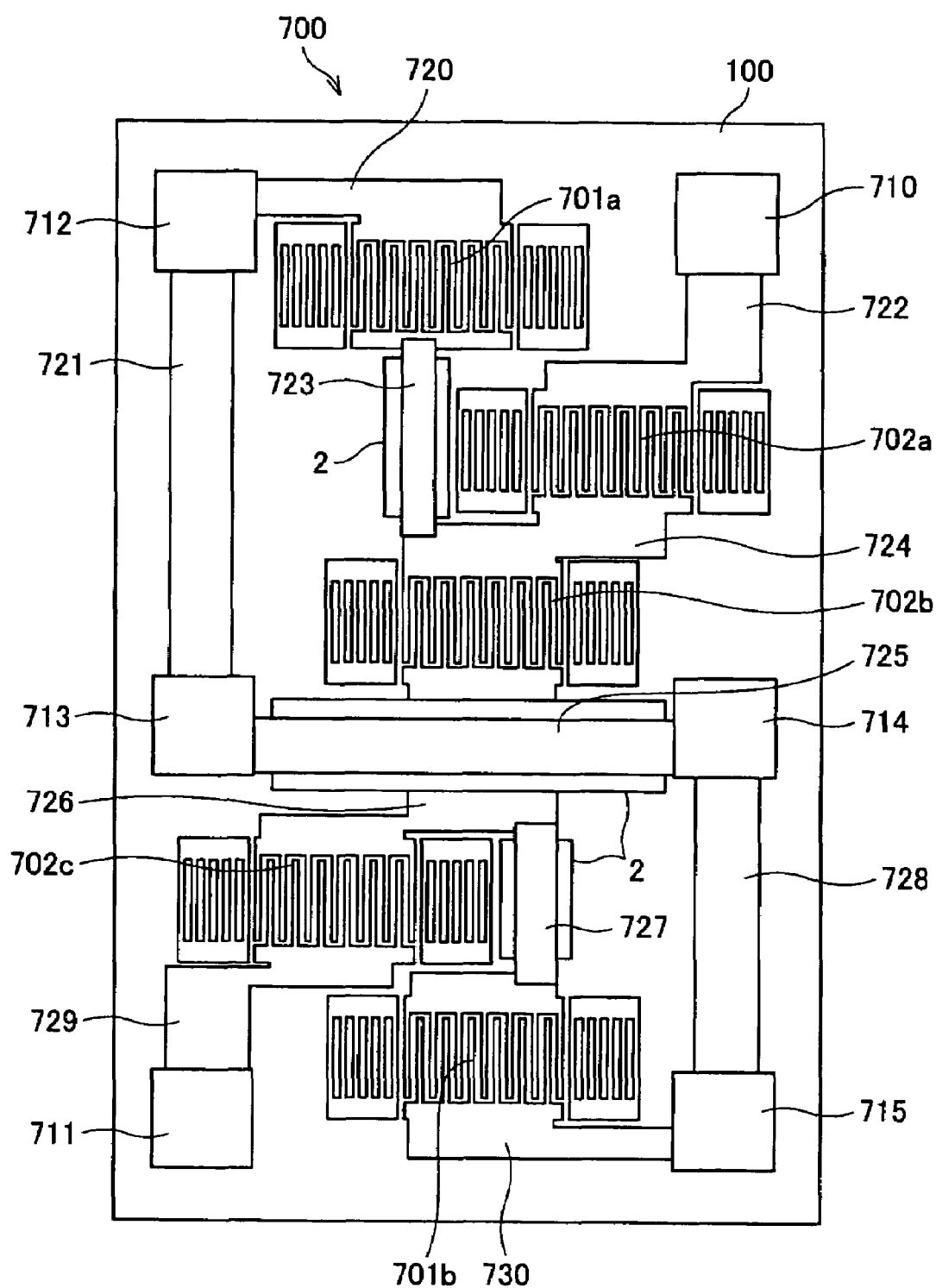
FIG. 14 is a plan view of a SAW filter according to a fourth preferred embodiment of the present invention.

FIG. 14 shows a SAW ladder filter 700 according to a fourth preferred embodiment of the present invention. All of one-terminal-pair SAW resonators 701a, 701b, 702a, 702b, and 702c, wiring traces 720 to 722, 724, 726, and 728 to 730, an input pad 710, an output pad 711, and ground pads 712 to 715 are part of the first conductor pattern on the piezoelectric substrate 100.

Wiring traces 723, 725, and 727 are part of the second conductor pattern, which are on the resin pattern 2. Among them, the wiring trace 725 is three-dimensionally crossed with the wiring trace 726, with the resin pattern 2 therebetween, such that the two wiring traces are not in conduction. The one-terminal-pair SAW resonators 701a and 701b are parallel-arm resonators and the one-terminal-pair SAW resonators 702a to 702c are series-arm resonators.

In the SAW filter 700, by forming the wiring traces 723, 725, and 727 on the resin pattern 2, parasitic capacitance between the wiring traces is reduced. Also, insertion loss in the pass band is reduced and the suppression level outside the pass band (particularly, in the high-frequency side) is increased.

In particular, at least one of the wiring traces other than the wiring traces 720, 721, 725, 728, and 730 for establishing conduction among the ground pads 712 to 715 and the one-terminal-pair SAW resonators 701a and 701b defining parallel-arm resonators, that is, at least one of the wiring traces 722, 724, 726, and 729 in a signal line defining a path of an electric signal extending from the input pad 710 as an input terminal to the output pad 711 as an output terminal, and the wiring traces 723 and 727 which have the same potential as that of the signal line and which are electrically connected to the signal line, is disposed on the resin pattern 2. With this configuration, parasitic capacitance between the wiring traces is reduced and ground capacitance generated between a package and each wiring trace through the piezoelectric substrate 100 is reduced. Accordingly, insertion loss in the pass band is reduced and the suppression level outside the pass band is effectively increased.

Further, by directly connecting the ground pads 713 and 714 by the wiring trace 725 using three-dimensional crossing, all the ground pads 712 to 715 connected to the parallel resonators are electrically continuous and the ground is reinforced with adequate layout. Particularly, by adopting this configuration in a dual filter, in which two filter elements are provided in one piezoelectric substrate 100, commonality is provided among the ground pads, and reinforcement of the ground and miniaturization of a chip are achieved.

Fifth Preferred Embodiment

Figure 15:
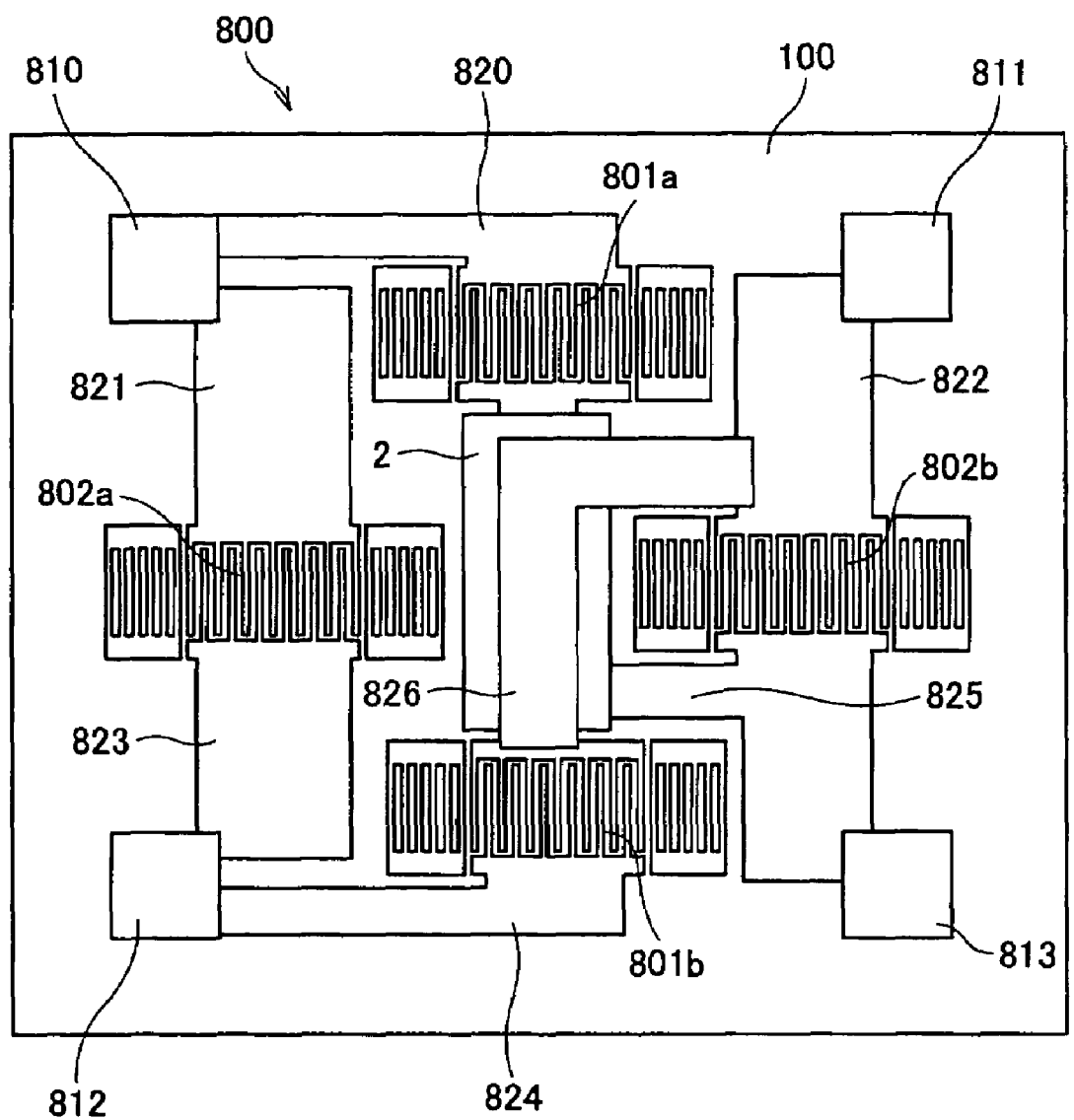
FIG. 15 is a plan view of a SAW filter according to a fifth preferred embodiment of the present invention.

FIG. 15 shows a SAW filter 800 according to a fifth preferred embodiment of the present invention. The SAW filter 800 includes four one-terminal-pair SAW resonators 801a, 801b, 802a, and 802b connected in a lattice pattern and defines a band-pass filter of balanced input-balanced output. The specific operating principles of the lattice filter are known, and thus they are not described here.

All of the one-terminal-pair SAW resonators 801a, 801b, 802a, and 802b, wiring traces 820 to 825, input pads 810 and 811, and output pads 812 and 813 are part of the first conductor pattern on the piezoelectric substrate 100.

A wiring trace 826 is part of the second conductor pattern and is disposed on the resin pattern 2. The wiring trace 826 is three-dimensionally crossed with the wiring trace 825 with the resin pattern 2 therebetween, such that the both wiring traces are not in conduction.

The wiring trace 825 connects the one-terminal-pair SAW resonators 801a and 802b and the output pad 813, whereas the wiring trace 826 connects the one-terminal-pair SAW resonators 801b and 802b and the input pad 811. The one-terminal-pair SAW resonators 801a and 801b are lattice-arm resonators and the one-terminal-pair SAW resonators 802a and 802b are series-arm resonators.

In the SAW filter 800, the wiring trace 826 is disposed on the resin pattern 2. With this configuration, capacitance between the wiring traces 825 and 826 is reduced. Also, insertion loss in the pass band is reduced and the suppression level outside the pass band (particularly, in the high-frequency side) is increased. Further, since the wiring traces 825 and 826 are crossed three-dimensionally with each other and are adequately laid out, miniaturization of the chip is achieved.

Sixth Preferred Embodiment

A SAW filter according to a sixth preferred embodiment of the present invention will be described with reference to FIGS. 16A and 16B. FIG. 16B is a cross-sectional view taken along the line a-b in FIG. 16A.

In this SAW filter, the resin pattern 2, longitudinally coupled resonator SAW filters 102 to 105, wiring traces, and pads 114 to 119 are disposed on the piezoelectric substrate 100. As shown in FIG. 16B, in the vertical direction, the piezoelectric substrate 100 is at the lowermost position, and the resin pattern 2 and the wiring traces 106 to 109 are disposed in this order. Herein, the resin pattern 2 is a polyimide film having a thickness of about 1 μm.

Figure 16A:
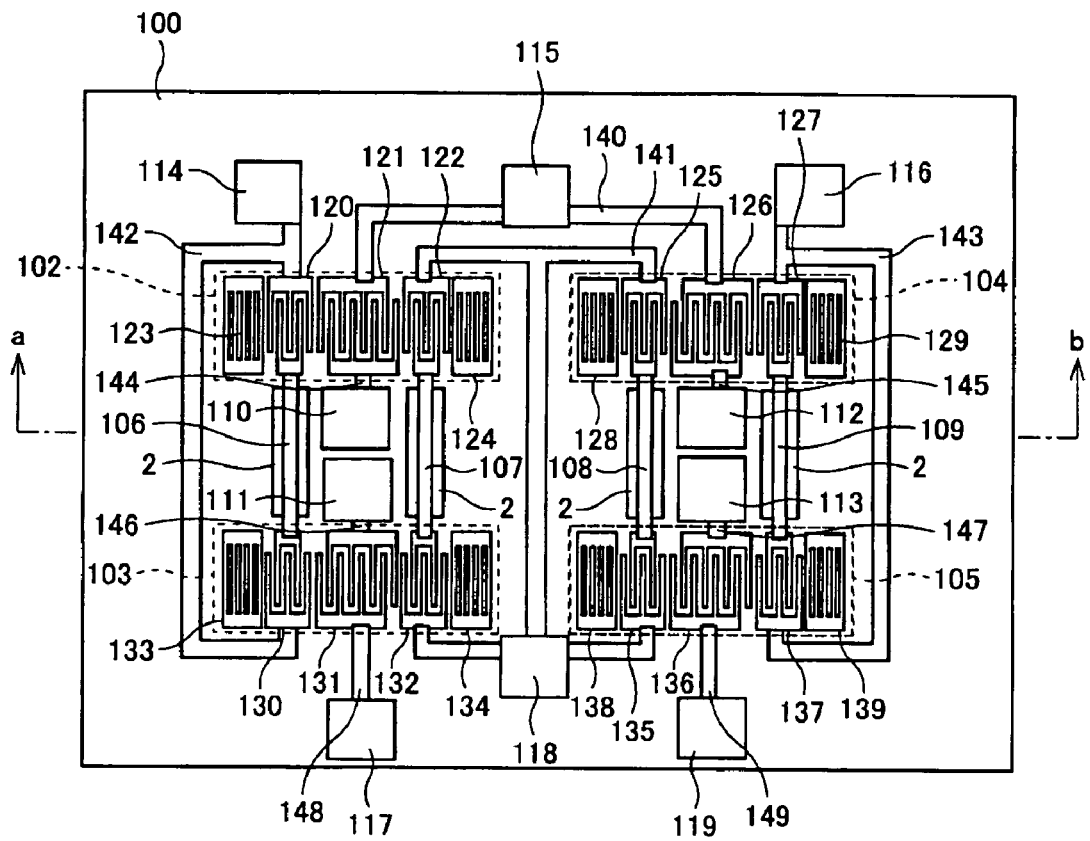
FIG. 16A is a plan view of a SAW filter according to a sixth preferred embodiment of the present invention.
Figure 16B:
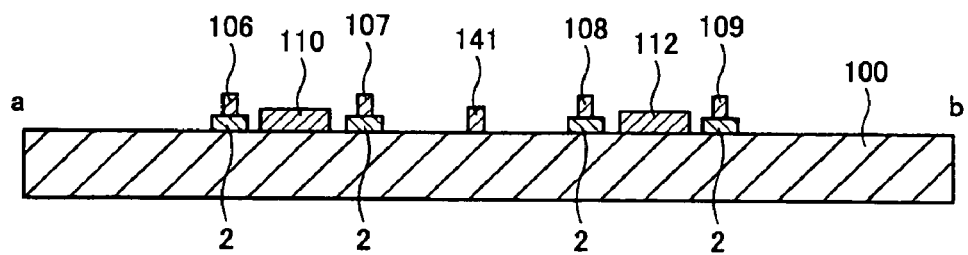
FIG. 16B is a cross-sectional view taken along the line a-b in FIG. 16A.

In the configuration shown in FIG. 16A, the longitudinally coupled resonator SAW filters 102 and 103 are cascaded through the wiring traces 106 and 107.

Likewise, the longitudinally coupled resonator SAW filters 104 and 105 are cascaded through the wiring traces 108 and 109.

In the longitudinally coupled resonator SAW filter 102, an IDT 121 is between IDTs 120 and 122, and reflectors 123 and 124 are disposed on both outer sides.

In the longitudinally coupled resonator SAW filter 104, an IDT 126 is between IDTs 125 and 127, and reflectors 128 and 129 are disposed on both outer sides.

In the longitudinally coupled resonator SAW filter 104, the direction of the IDT 126 is reversed in the interdigital-width direction with respect to the IDT 121 of the longitudinally coupled resonator SAW filter 102. The number of electrode fingers of each of the IDTs 121 and 126 is even.

The pad 115 defines an input pad and the pads 117 and 119 define output pads. The pads 110 to 113,114,116, and 118 define ground pads.

The wiring trace 140 electrically connects the input pad 115 and the IDTs 121 and 126. The wiring trace 106 electrically connects the IDTs 120 and 130. The wiring trace 107 electrically connects the IDTs 122 and 132. The wiring trace 108 electrically connects the IDTs 125 and 135. The wiring trace 109 electrically connects the IDTs 127 and 137. The wiring trace 148 electrically connects the IDT 131 and the output pad 117. The wiring trace 149 electrically connects the IDT 136 and the output pad 119. The wiring trace 144 electrically connects the IDT 121 and the ground pad 110.

The wiring trace 145 electrically connects the IDT 126 and the ground pad 112. The wiring trace 146 electrically connects the IDT 131 and the ground pad 111. The wiring trace 147 electrically connects the IDT 136 and the ground pad 113. The wiring trace 142 electrically connects the IDTs 120 and 130 and the ground pad 114. The wiring trace 143 electrically connects the IDTs 127 and 137 and the ground pad 116. The wiring trace 141 electrically connects the IDTs 122, 125, 132, and 135 and the ground pad 118.

Portions of the wiring traces 106 to 109 are disposed on the resin pattern 2, such that those portions are not directly in contact with the piezoelectric substrate 100. In FIG. 16A, only portions of the wiring traces 106 to 109 are on the resin pattern 2, however, portions of all the wiring traces may be on the resin pattern 2.

Hereinafter, advantages of this preferred embodiment will be described.

When at least a portion of the wiring traces is disposed on the resin pattern 2, that portion is not directly in contact with the substrate of high permittivity and is held on the substrate with the resin pattern 2 of low permittivity therebetween.

Therefore, capacitance between that wiring trace and another wiring trace is reduced.

For example, when two wiring traces having a width of about 20 μm are arranged in parallel with an interval of about 20 μm on a LiTaO₃ substrate, capacitance between the two wiring traces can be reduced to about ½ by disposing one of the wiring traces on the resin pattern 2 having relative permittivity of 2 and thickness of about 1 μm. Further, capacitance between the two wiring traces can be reduced to about ⅓ by disposing both wiring traces on the resin pattern 2 having relative permittivity of about 2 and thickness of about 1 μm, as compared to a case where no resin pattern 2 is provided. The same effects are obtained by using an insulating pattern other than the resin pattern 2 in principle, however, the following three advantages are obtained by using the resin pattern 2. These advantages are based on comparison with an insulating pattern including a ceramic material, which is generally used for an insulating pattern.

A first advantage is that relative permittivity is reduced. The relative permittivity of a ceramic material is no less than about 4, and it often has a relative permittivity of about 10 or more. On the other hand, the relative permittivity of a resin material is about 2. Thus, by providing a resin between a wiring trace and a piezoelectric substrate, capacitance between them is significantly reduced.

A second advantage is that a thick pattern is easily formed. As the thickness of the pattern provided between a wiring trace and a piezoelectric substrate is greater, the capacitance between the wiring trace and the piezoelectric substrate is more significantly reduced. A pattern including a ceramic material has a large internal stress. Therefore, when a pattern having a precision of several μm is formed using a ceramic material, the thickness thereof is several hundreds of nm at a maximum. On the other hand, the resin pattern 2 has a small internal stress. Therefore, when a pattern having a precision of several μm is formed using a resin, the thickness thereof can be set to several μm, or approximately 10 μm or more in some cases.

A third advantage is that a pattern is easily formed. When an insulating pattern including a ceramic material is formed on a piezoelectric substrate, on which a SAW filter is formed, a vacuum deposition process and a patterning process must be performed, which are difficult and lead to increased cost.

On the other hand, in order to form the resin pattern 2, a resin layer is easily formed with low cost by spin-coating or spraying a liquid resin or by bonding a resin sheet, without performing vacuum deposition. Further, by using a photosensitive resin material, patterning of the produced resin layer is easily performed by exposing the resin layer to light through a photo mask.

In the configuration shown in FIG. 16A, portions of the wiring traces 106 and 107 for connecting the longitudinally coupled resonator SAW filters 102 and 103 and portions of the wiring traces 108 and 109 for connecting the longitudinally coupled resonator SAW filters 104 and 105 are on the resin pattern 2, and those portions are not directly in contact with the piezoelectric substrate 100. Therefore, ground capacitance generated between the wiring traces 106 and 107 and the ground pads 110 and 111 is less than a case where the resin pattern 2 is not provided. This is also true between the wiring traces 108 and 109 and the ground pads 112 and 113.

In the sixth preferred embodiment, the ground capacitance in the interstage portion for connecting the longitudinally coupled resonator SAW filters 102 and 103 or the longitudinally coupled resonator SAW filters 104 and 105 is reduced. Accordingly, impedance matching at the interstage portion is easily achieved, and thus, insertion loss and VSWR in the pass band is improved.

Figure 17A:
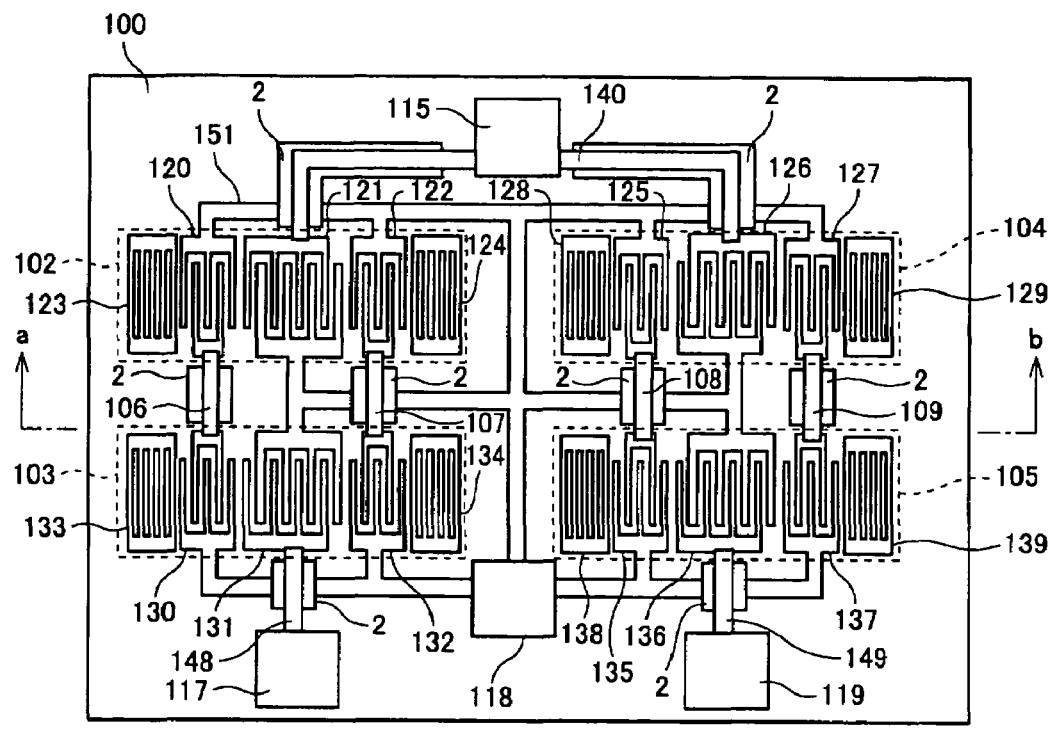
FIG. 17A is a plan view of a SAW filter according to a modification of the sixth preferred embodiment.
Figure 17B:
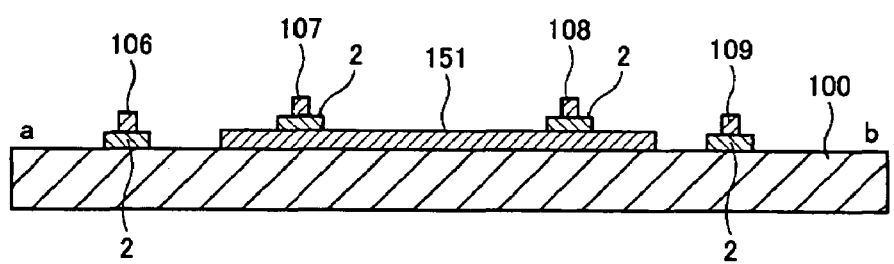
FIG. 17B is a cross-sectional view taken along the line a-b in FIG. 17A.

Next, a modification of the sixth preferred embodiment will be described with reference to FIGS. 17A and 17B. FIG. 17B is a cross-sectional view taken along the line a-b in FIG. 17A. In FIGS. 17A and 17B, parts denoted by the same reference numerals as in FIGS. 16A and 16B have the same function as that in FIGS. 16A and 16B, and thus the corresponding description will be omitted.

The differences between FIGS. 16A and 16B and FIGS. 17A and 17B are the shape of a wiring trace 151 and the existence of ground pads in the interstage portions. Hereinafter, the different points will be described.

The wiring trace 151 electrically connects one of comb electrodes of each of the IDTs 120 and 122 and one of comb electrodes of the IDT 121. Also, the wiring trace 151 electrically connects one of comb electrodes of each of the IDTs 125 and 127 and one of comb electrodes of the IDT 126. The wiring trace 151 electrically connects one of comb electrodes of each of the IDTs 130 and 132 and one of comb electrodes of the IDT 131. Also, the wiring trace 151 electrically connects one of comb electrodes of each of the IDTs 135 and 137 and one of comb electrodes of the IDT 136. Further, the wiring trace 151 is electrically connected to the ground pad 118.

The wiring traces 140 and 151 are three-dimensionally crossed. At the crossing portions, the wiring trace 151 defines a lower-layer wiring, the resin pattern 2 defines an interlayer insulating film, and the wiring trace 140 defines an upper-layer wiring. These wiring traces are crossed without being in conduction with each other. Likewise, the wiring traces 151 and 107, and the wiring traces 151 and 108 are three-dimensionally crossed. Also, the wiring traces 151 and 148, and the wiring traces 151 and 149 are three-dimensionally crossed.

The resin pattern 2 is disposed between the piezoelectric substrate 100 and the wiring traces 106 and 109, which are not crossed with any other wiring traces.

In this modification of the sixth preferred embodiment, the same advantages as in the sixth preferred embodiment are obtained. Further, by providing three-dimensionally crossing portions, each of the IDTs 121, 126, and 131 is grounded without providing the ground pads 110 to 113 in the interstage portions shown in FIG. 16A. Accordingly, ground capacitance at the interstage portions is further reduced, insertion loss in the pass band is reduced, and VSWR is improved.

Also, by arranging the wiring traces by three-dimensionally crossing them, the area of element is reduced and the SAW filter is miniaturized. Further, the length of wiring traces for transmitting signals is reduced, and thus, insertion loss in the pass band is effectively reduced.

Next, another modification of the sixth preferred embodiment will be described with reference to FIG. 18. In this modification, parts denoted by the same reference numerals as in FIGS. 16A and 16B have the same function as that in FIGS. 16A and 16B, and thus the corresponding description will be omitted.

Figure 18:
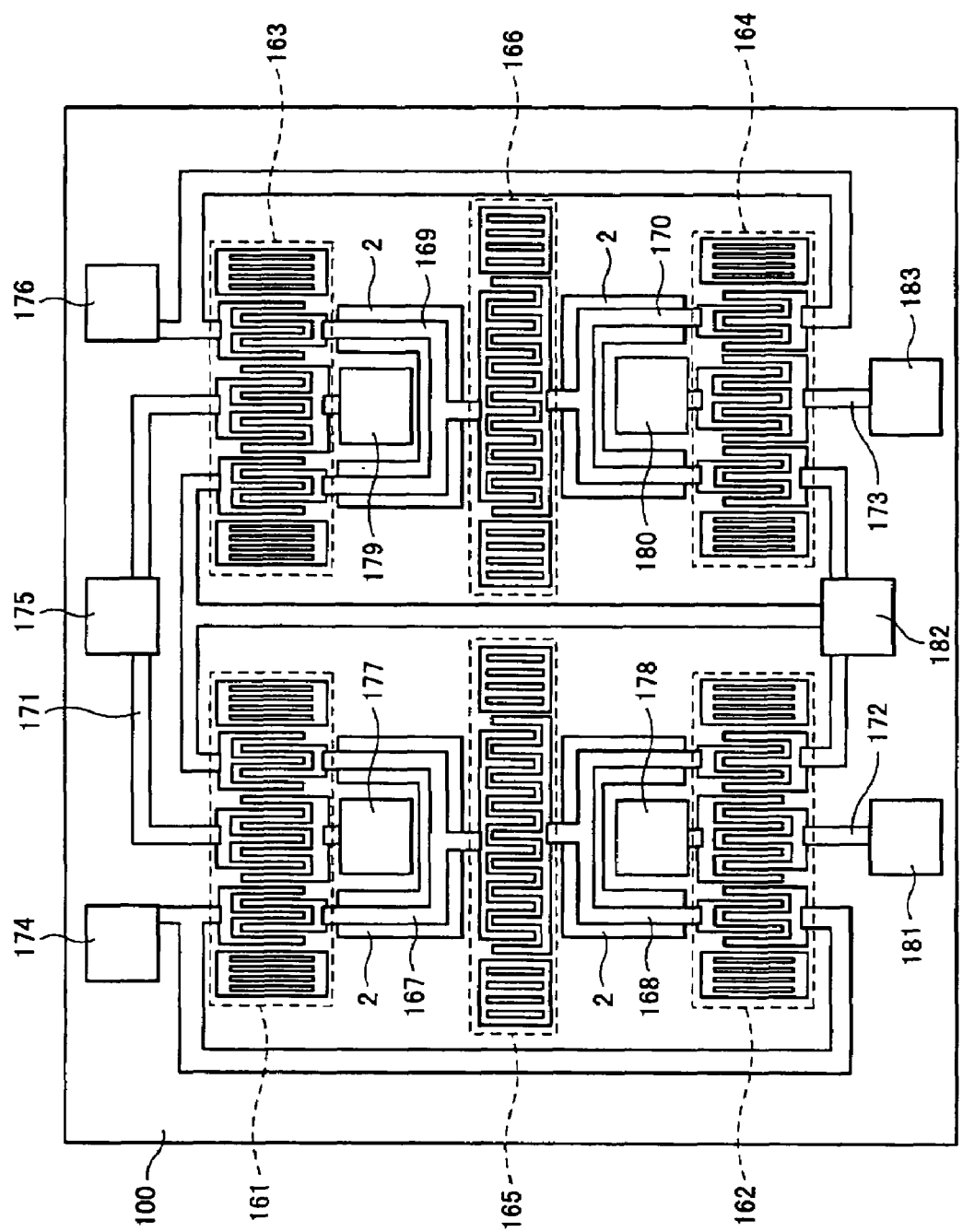
FIG. 18 is a plan view of a SAW filter according to another modification of the sixth preferred embodiment of the present invention.

As shown in FIG. 18, the resin pattern 2, longitudinally coupled resonator SAW filters 161 to 164, one-terminal-pair SAW resonators 165 and 166, and wiring traces are disposed on the piezoelectric substrate 100.

In the configuration shown in FIG. 18, two stages of the longitudinally coupled resonator SAW filters 161 and 162 are cascaded, and the one-terminal-pair SAW resonator 165 is connected in series between the two longitudinally coupled resonator SAW filters 161 and 162.

Likewise, two stages of the longitudinally coupled resonator SAW filters 163 and 164 are cascaded, and the one-terminal-pair SAW resonator 166 is connected in series between the two longitudinally coupled resonator SAW filters 163 and 164.

The one-terminal-pair SAW resonators 165 and 166 function so as to increase the signal suppression level in the cut-off region in the high-frequency side of the pass band. Each of the one-terminal-pair SAW resonators 165 and 166 is designed such that the impedance near the high-frequency side of the pass band is inductive, and functions so as to improve impedance matching in this frequency region.

Portions of wiring traces 167 to 170 are disposed on the resin pattern 2, and thus, the portions are not directly in contact with the piezoelectric substrate 100. In FIG. 18, only portions of the wiring traces 167 to 170 are on the resin pattern 2, but portions of all the wiring traces may be disposed on the resin pattern 2. A pad 175 defines an input terminal and pads 181 and 183 define output terminals. Pads 174, 176, 177, 178, 179, 180, and 182 define ground pads.

In this modification of the sixth preferred embodiment, the advantages of the sixth preferred embodiment are obtained. In addition, by disposing wiring traces for connecting stages on the resin pattern 2, capacitance is reduced even if an interstage trap exists.

Next, still another modification of the sixth preferred embodiment will be described with reference to FIG. 19. In this modification, parts denoted by the same reference numerals as in FIG. 18 have the same function as that in FIG. 18, and thus the corresponding description will be omitted.

Figure 19:
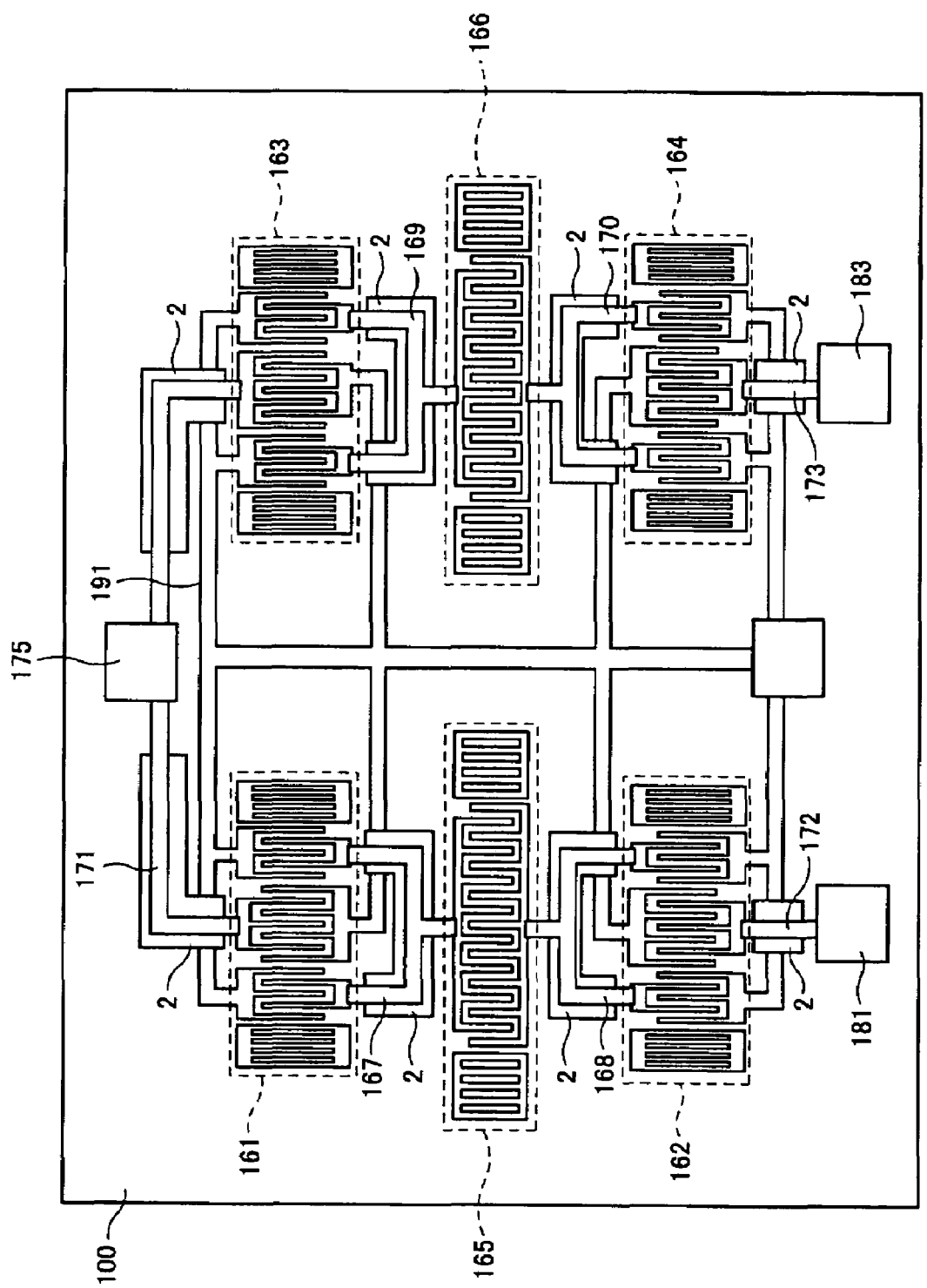
FIG. 19 is a plan view of a SAW filter according to still another modification of the sixth preferred embodiment of the present invention.

As shown in FIG. 19, the resin pattern 2, the longitudinally coupled resonator SAW filters 161 to 164, the one-terminal-pair SAW resonators 165 and 166, and wiring traces are disposed on the piezoelectric substrate 100.

The wiring trace 171 is three-dimensionally crossed with a wiring trace 191. At the crossing portions, the wiring trace 191 defines a lower-layer wiring, the resin pattern 2 defines an interlayer insulating film, and the wiring trace 171 defines an upper-layer wiring. These wiring traces are crossed without being in conduction with each other. Likewise, the wiring traces 191 and 167, the wiring traces 191 and 168, the wiring traces 191 and 169, and the wiring traces 191 and 170 are three-dimensionally crossed.

Also, the wiring traces 191 and 172 and the wiring traces 191 and 173 are three-dimensionally crossed. In the modification shown in FIG. 19, the same advantages as in the configurations shown in FIGS. 17A, 17B, and 18 are obtained.

Figure 20:
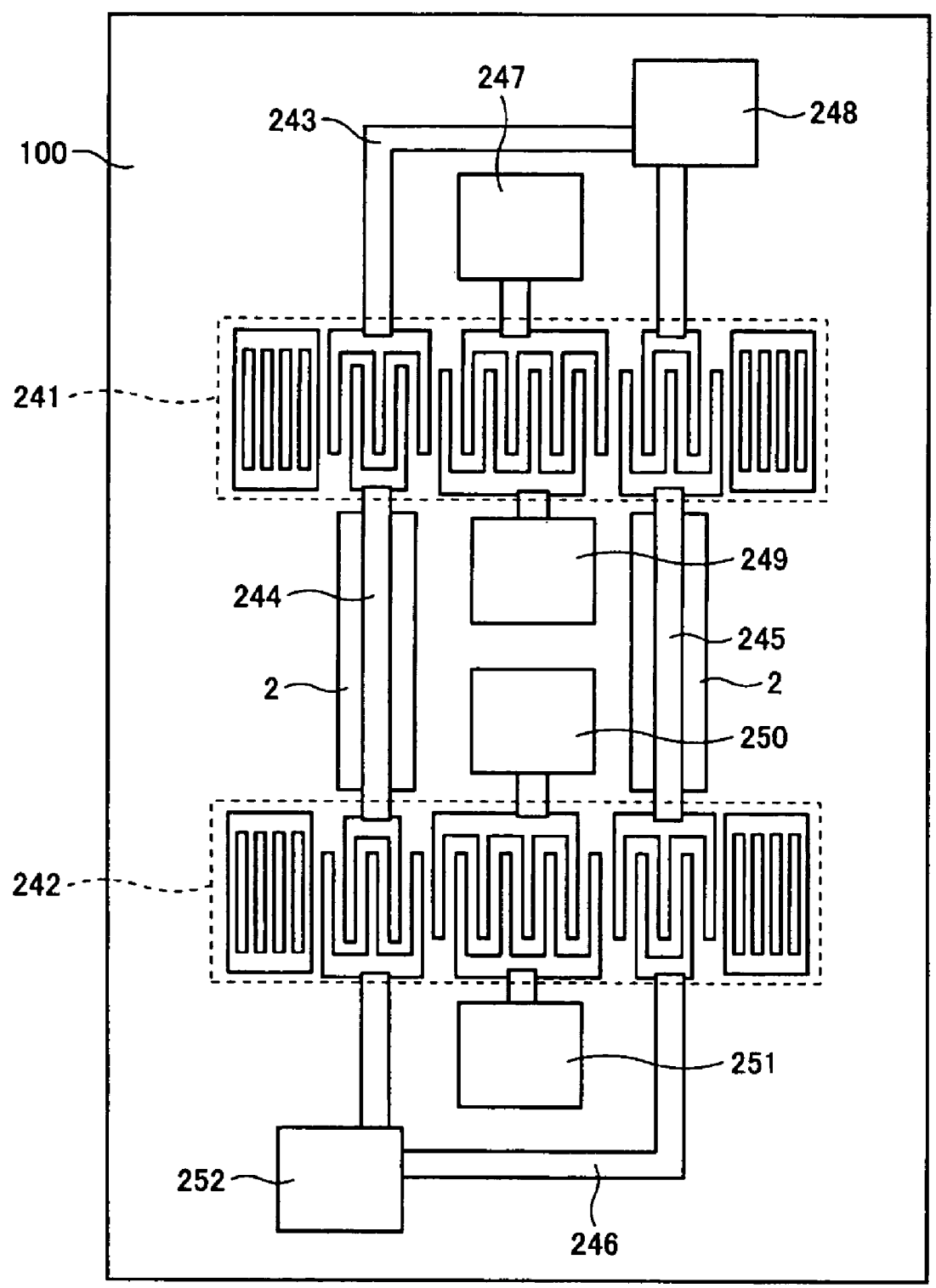
FIG. 20 is a plan view of a SAW filter according to still another modification of the sixth preferred embodiment of the present invention.

Next, still another modification of the sixth preferred embodiment will be described with reference to FIG. 20. As shown in FIG. 20, the resin pattern 2, longitudinally coupled resonator SAW filters 241 and 242, and wiring traces are disposed on the piezoelectric substrate 100. In the configuration shown in FIG. 20, two stages of the longitudinally coupled resonator SAW filters 241 and 242 are cascaded. Also, a pad 247 defines an input terminal and pads 250 and 251 define output terminals. Pads 248, 249, and 252 define ground pads.

Portions of wiring traces 244 and 245 are disposed on the resin pattern 2, and those portions are not directly in contact with the piezoelectric substrate 100. Although only portions of the wiring traces 244 and 245 are on the resin pattern 2 in FIG. 20, portions of all the wiring traces may be disposed on the resin pattern 2.

In this modification shown in FIG. 20, the same advantages as those in the above-described sixth preferred embodiment and its modifications are obtained.

Figure 21:
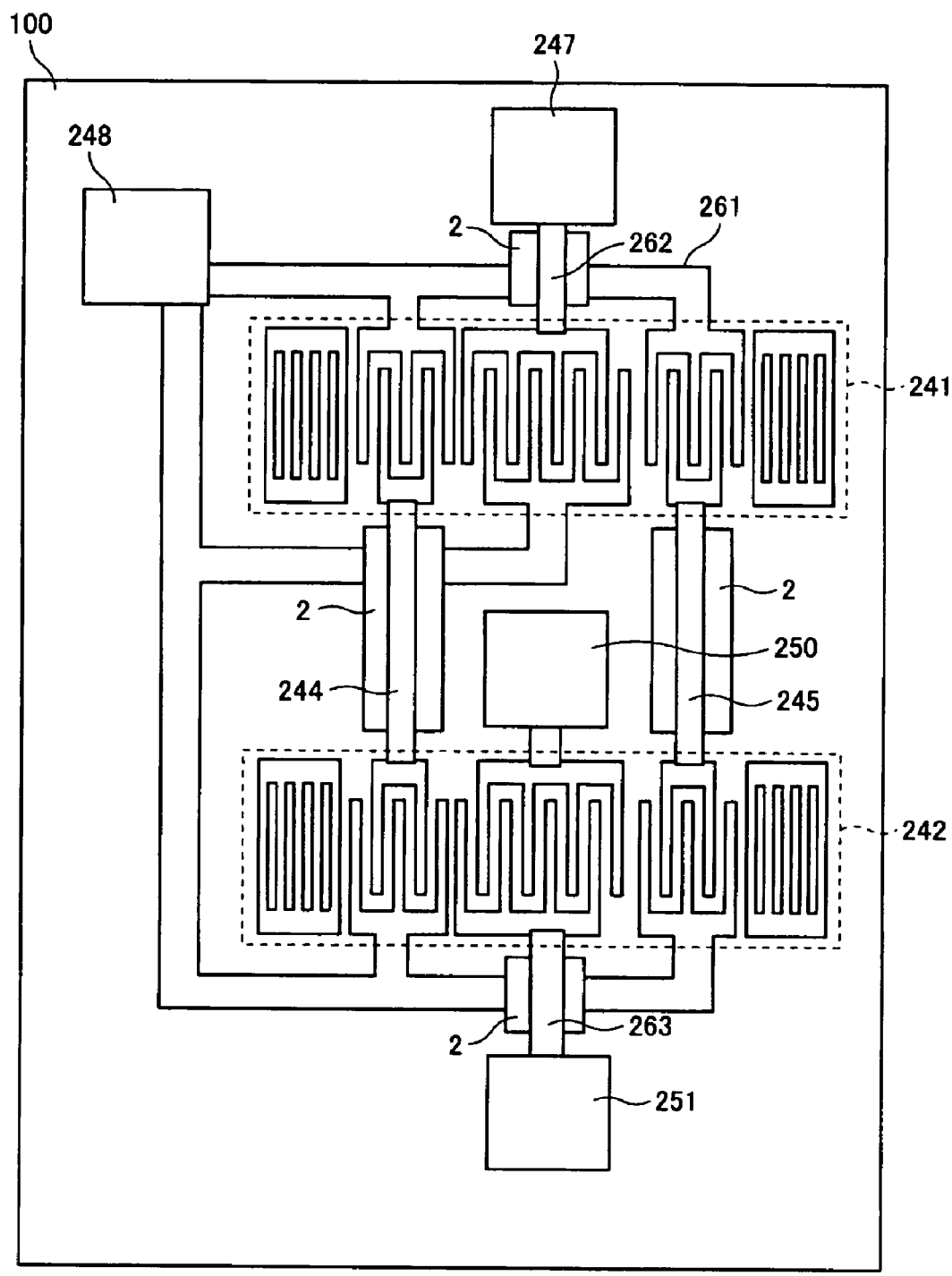
FIG. 21 is a plan view of a SAW filter according to still another modification of the sixth preferred embodiment of the present invention.

Next, still another modification of the sixth preferred embodiment will be described with reference to FIG. 21. As shown in FIG. 21, the resin pattern 2, the longitudinally coupled resonator SAW filters 241 and 242, and wiring traces are disposed on the piezoelectric substrate 100. In FIG. 21, parts denoted by the same reference numerals as those in FIG. 20 have the same function as in FIG. 20.

Wiring traces 261 and 262 are three-dimensionally crossed. At the crossing portion, the wiring trace 261 defines a lower-layer wiring, the resin pattern 2 defines an interlayer insulating film, and the wiring trace 262 defines an upper layer wiring, and these traces are crossed without being in conduction with each other. Also, the wiring traces 261 and 244 and the wiring traces 261 and 263 are three-dimensionally crossed. At the crossing portions, the resin pattern 2 is sandwiched between the piezoelectric substrate 100 and the wiring traces.

In this modification shown in FIG. 21, the same advantages as those in the configuration shown in FIG. 17 are obtained.

Figure 22:
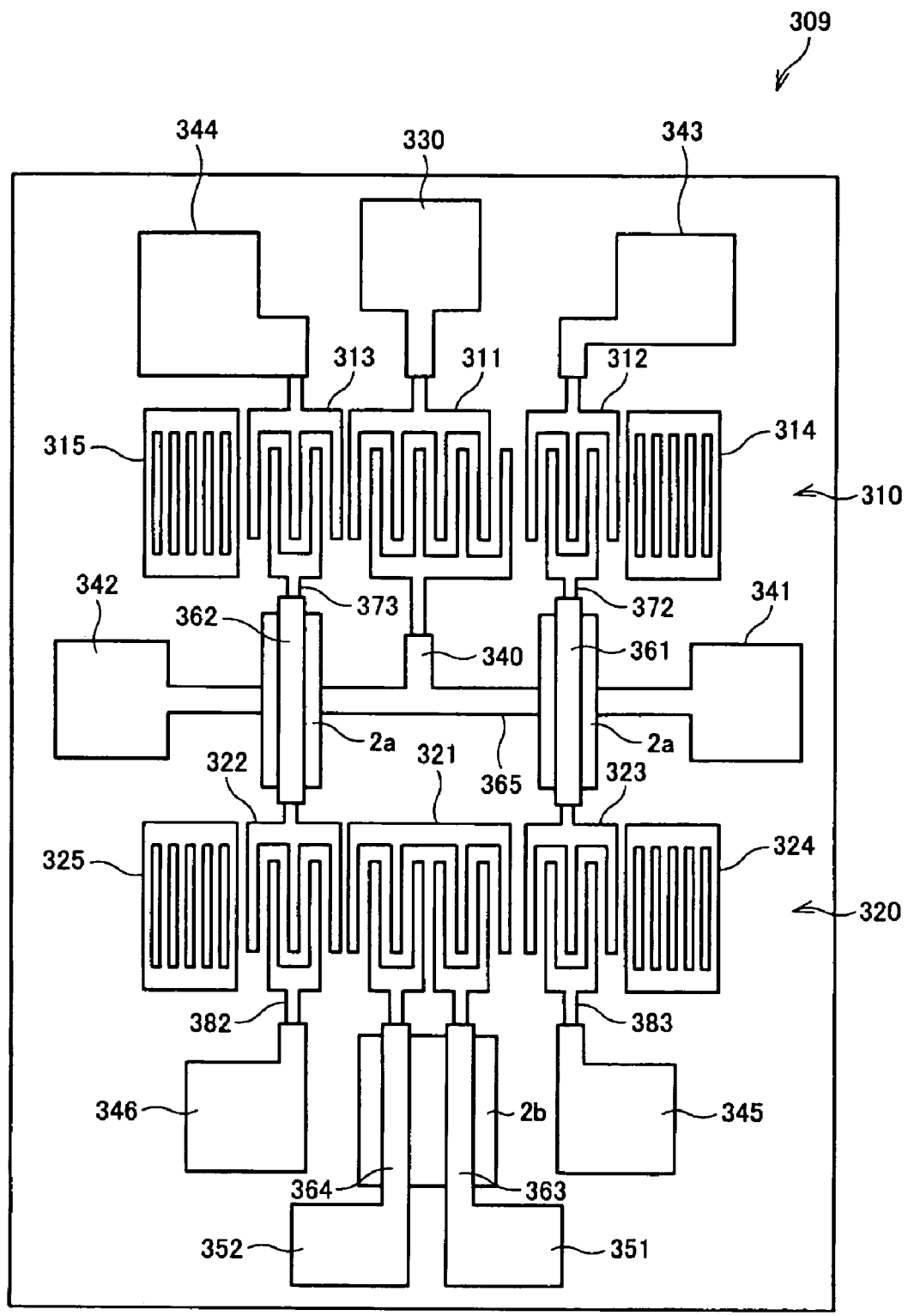
FIG. 22 is a plan view of a SAW filter according to still another modification of the sixth preferred embodiment of the present invention.

Next, still another modification of the sixth preferred embodiment will be described with reference to FIG. 22. As shown in FIG. 22, longitudinally coupled resonator SAW filters 310 and 320 are cascaded so as to define a balance-to-unbalance SAW filter 309, in which the input side is an unbalanced terminal and the output side is a balanced terminal.

The longitudinally coupled resonator SAW filter 310 includes three IDTs 311, 312, and 313 and reflectors 314 and 315 that sandwich the IDTs. One of the comb electrodes of the central IDT 311 is connected to an input terminal 330 defining an unbalanced terminal, and the other comb electrode of the IDT 311 is connected to a wiring trace 340 on the ground side. Also, the wiring trace 340 is connected to ground pads 341 and 342 to be connected to the external ground.

In each of the IDTs 312 and 313 on both sides (along the SAW propagation direction) of the central IDT 311, one of the comb electrodes is connected to ground pads 343 and 344, respectively, through wiring traces. Also, the other comb electrodes of the IDTs 312 and 313 are connected to wiring traces 361 and 362 used for cascade connection in the SAW filter 309, respectively.

Likewise, the longitudinally coupled resonator SAW filter 320 includes three IDTs 321, 322, and 323 and reflectors 324 and 325. One of comb electrodes of the central IDT 321 includes two portions aligned in the SAW propagation direction, and the two portions are connected to output terminals 351 and 352 defining balanced terminals through wiring traces 363 and 364, respectively.

The other comb electrode of the IDT 321 is a floating electrode. Although the other comb electrode of the IDT 321 is a floating electrode, the other comb electrode may be connected to the ground. One of comb electrodes of each of the IDTs 322 and 323 on both sides of the central IDT 321 are connected to ground pads 346 and 345 through wiring traces 382 and 383, respectively. The other comb electrodes of the IDTs 322 and 323 are connected to the wiring traces 362 and 361 used for cascade connection in the SAW filter 309, respectively. The wiring traces 361 and 362 are crossed with the wiring trace 340, which connects the ground pads 341 and 342. Herein, a resin pattern 2a is disposed on the lower surfaces of the wiring traces 361 and 362 so as not to be electrically connected with the wiring trace 340. The resin pattern 2a includes a polyimide resin having low relative permittivity. Therefore, stray capacitance generated between the wiring traces 361 and 362 and the ground is reduced. Accordingly, reflection characteristics in the pass band of the SAW filter 309 are improved.

In this configuration, the wiring traces 361 and 362 used for cascade connection in the SAW filter 309 are crossed with the wiring trace 340, which is a ground wiring. Therefore, large ground pads for bonding are not required between the longitudinally coupled resonator SAW filters 310 and 320, and thus, the balance-to-unbalance SAW filter 309 is significantly miniaturized.

Also, since a resin pattern 2b is disposed on the lower surfaces of the wiring traces 363 and 364, the wiring traces 363 and 364 are not directly in contact with the piezoelectric substrate having high relative permittivity. Accordingly, stray capacitance between the wiring traces 363 and 364 is reduced. With this configuration, the degree of balance is increased because the stray capacitance between the wiring traces 363 and 364.

Seventh Preferred Embodiment

Figure 23A:
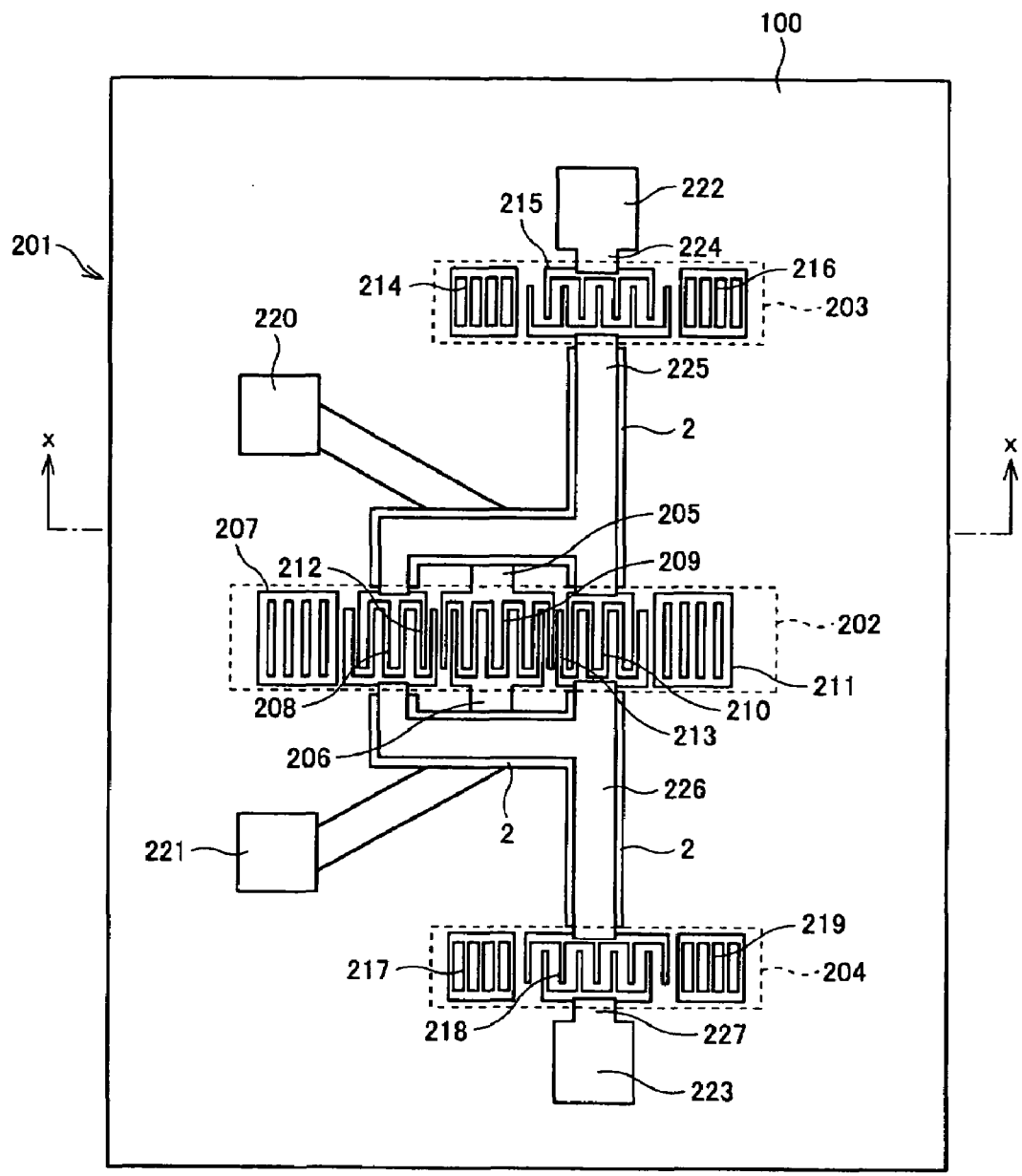
FIG. 23A is a plan view of a SAW filter according to a seventh preferred embodiment of the present invention.
Figure 23B:
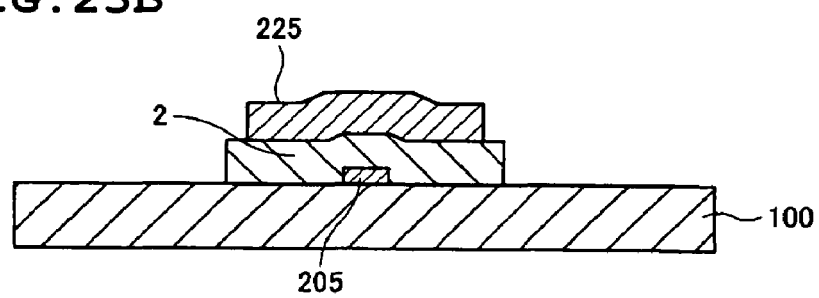
FIG. 23B is a cross-sectional view taken along the line X-X in FIG. 23A.

FIGS. 23A and 23B show a SAW filter 301 according to a seventh preferred embodiment of the present invention. In this preferred embodiment, a receiving filter for W-CDMA is used as an example. FIG. 23B is a cross-sectional view taken along the line X-X in FIG. 23A.

The first and second conductor patterns and the resin pattern 2 are disposed on the piezoelectric substrate 100. In the vertical direction to the plane of FIG. 23A, the piezoelectric substrate 100 is at the lowermost position, and the first conductor pattern, the resin pattern 2, and the second conductor pattern are disposed in this order as shown in FIG. 23B. The piezoelectric substrate 100 is a 38.5° rotated Y-cut X-propagation $LiTaO_3$ single crystal. The first conductor pattern is an aluminum thin-film having a thickness of about 180 nm. The resin pattern 2 is a polyimide film having a thickness of about 2 μm. The second conductor pattern includes two layers of thin-films, in which the lower layer is a nichrome thin-film which is about 200 nm thick and the upper layer is an aluminum thin-film which is about 1140 nm thick.

The first conductor pattern defines three-IDT longitudinally coupled resonator SAW filter 202, SAW resonators 203 and 204, and wiring traces 205 and 206.

The longitudinally coupled resonator SAW filter 202 includes a reflector 207, IDTs 208 to 210, and a reflector 211, which are arranged along the SAW propagation direction. As shown in FIG. 23A, the pitch of a few electrode fingers in the borders between the IDTs 208 and 209 and between the IDTs 209 and 210 (at the portions 212 and 213 in FIG. 23A) is less than that in the other portion of the IDTs. Further, the IDT-IDT interval is about 0.5 times the wavelength of the surrounding IDTs. Accordingly, loss caused by components emitted as bulk waves is reduced. The SAW resonator 203 includes a reflector 214, an IDT 215, and a reflector 216, which are arranged along the SAW propagation direction. Likewise, the SAW resonator 204 includes a reflector 217, an IDT 218, and a reflector 219, which are arranged along the SAW propagation direction.

The specific design of the longitudinally coupled resonator SAW filter 202 is described below. Herein, the wavelength depending on pitch of small-pitch electrode fingers is $\lambda I2$, the wavelength depending on pitch of other electrode fingers is $\lambda I1$, and the wavelength of the reflectors is $\lambda R$.

Interdigital width: 29.8 $\lambda I1$
The number of electrode fingers of IDTs (in the order of 208, 209, and 210): 36 (4)/(4) 46 (4)/(4) 36 (number in parentheses is the number of small-pitch electrode fingers)
IDT wavelength $\lambda I1$: 2.88 μm, $\lambda I2$: 2.72 μm ($\lambda I1$ corresponds to the part where pitch is not small, and $\lambda I2$ corresponds to the part where pitch is small)
Reflector wavelength $\lambda R$: 2.89 μm
The number of electrode fingers of each reflector: 220
IDT-IDT interval:
IDT-IDT interval of the part sandwiched by electrode fingers of wavelengths $\lambda I1$ and $\lambda I2$: 0.25 $\lambda I1$+0.25 $\lambda I2$
IDT-IDT interval of the part sandwiched by electrode fingers of wavelength $\lambda I2$: 0.50 $\lambda I2$
IDT-reflector interval: 0.55 $\lambda R$
IDT duty: 0.60
Reflector duty: 0.60
In FIG. 23A, fewer electrode fingers are shown.

The specific design of the two-terminal-pair SAW resonators 203 and 204 is described below. In FIG. 23A, fewer electrode fingers are shown.
Interdigital width: 32.4 $\lambda I$
The number of electrode fingers of IDT: 240
IDT wavelength and reflector wavelength $\lambda I$: 2.85 μm
The number of electrode fingers of each reflector: 30
IDT-reflector interval: 0.50 $\lambda R$
The second conductor pattern defines a first input pad 220, a second input pad 221, a first output pad 222, a second output pad 223, and wiring traces 224 to 227.

The wiring trace 205 enables the input pad 220 and the IDT 209 to be electrically continuous. The wiring trace 206 enables the input pad 221 and the IDT 209 to be electrically continuous. The wiring trace 224 enables the output pad 222 and the IDT 215 to be electrically continuous. The wiring trace 225 enables the IDT 215 and the IDTs 208 and 210 to be electrically continuous. The wiring trace 226 enables the IDT 218 and the IDTs 208 and 210 to be electrically continuous. The wiring trace 227 enables the output pad 223 and the IDT 218 to be electrically continuous.

Herein, portions of the wiring traces 225 and 226 are disposed on the resin pattern 2, and thus, the wiring traces 225 and 226 are not directly in contact with the piezoelectric substrate 100 at those portions. Also, the wiring trace 225 is three-dimensionally crossed with the wiring trace 205. At the crossing portion, the wiring trace 205 defines a lower-layer wiring formed by the first conductor pattern, the resin pattern 2 defines an interlayer insulating film, and the wiring trace 225 defines an upper-layer wiring formed by the second conductor pattern. With this configuration, the wiring traces 225 and 205 are crossed without being in conduction to each other.

Also, the wiring trace 226 is three-dimensionally crossed with the wiring trace 206. At the crossing portion, the wiring trace 206 defines a lower-layer wiring formed by the first conductor pattern, the resin pattern 2 defines an interlayer insulating film, and the wiring trace 226 defines an upper-layer wiring formed by the second conductor pattern. With this configuration, the two wiring traces are crossed without being in conduction to each other.

In this preferred embodiment, a portion of the wiring trace 225, through which an output signal flows, is disposed on the resin pattern 2, and the piezoelectric substrate 100 and the wiring trace 225 are not directly in contact with each other at the portion.

With this configuration, parasitic capacitance between the wiring trace 205 and the input pad 220 to which an input signal is applied and the wiring trace 225 through which an output signal flows in the longitudinally coupled resonator SAW filter 201 is less than a case where the resin pattern 2 is not provided. Likewise, a portion of the wiring trace 226, through which the output signal flows, is on the resin pattern 2, and the piezoelectric substrate 100 is not directly in contact with the wiring trace 226 at the portion.

Therefore, parasitic capacitance between the wiring trace 206 and the input pad 221 to which an input signal is applied and the wiring trace 226 through which an output signal flows in the longitudinally coupled resonator SAW filter 201 is less than a case where the resin pattern 2 is not provided.

Accordingly, in this preferred embodiment, insertion loss in the pass band and VSWR are advantageously improved as in the above-described first to sixth preferred embodiments.

The resin pattern 2 in each preferred embodiment may include an epoxy resin (glass-epoxy) or acrylic resin instead of polyimide. Although resin is preferably used, any insulating material may be used. Therefore, an insulating pattern using a ceramic material may also be used. As the ceramic material, $SiO_2$, $SiN$, or $Al_2O_3$ may be used.

Figure 24:
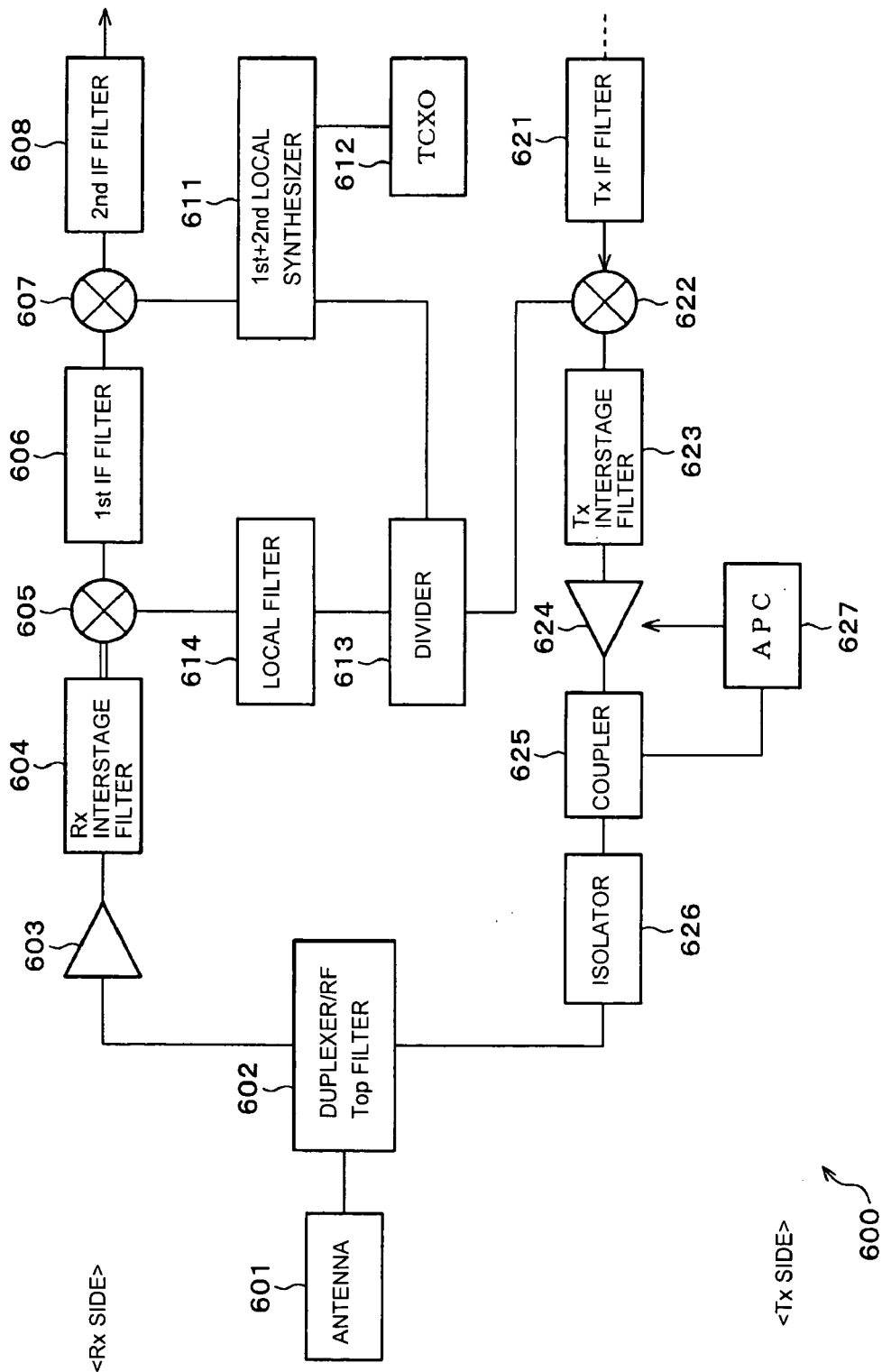
FIG. 24 is a circuit block diagram of a communication apparatus of the present invention.
Figure 25:
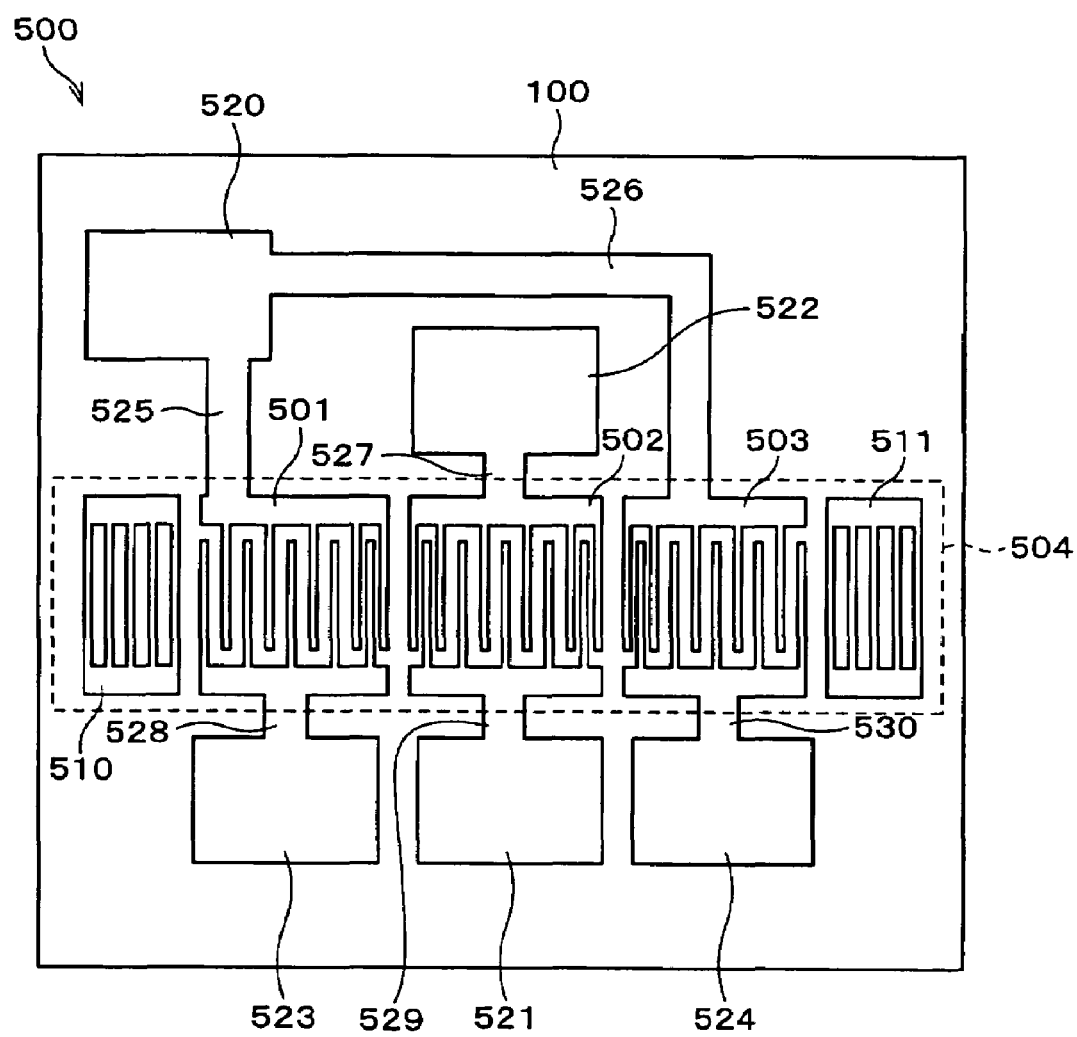
FIG. 25 is a plan view of a known SAW filter.

Next, a communication apparatus 600 including the SAW filter of various preferred embodiments of the present invention will be described with reference to FIG. 24. The receiver side (Rx side) for performing reception of the communication apparatus 600 includes an antenna 601, a duplexer/RF Top filter 602, an amplifier 603, an Rx interstage filter 604, a mixer 605, a 1st IF filter 606, a mixer 607, a 2nd IF filter 608, a 1st+2nd local synthesizer 611, a temperature compensated crystal oscillator (TCXO) 612, a divider 613, and a local filter 614. Preferably, balanced signals are transmitted from the Rx interstage filter 604 to the mixer 605 so as to ensure balance, as shown by two lines in FIG. 24.

The transmitter side (Tx side) for performing transmission of the communication apparatus 600 includes the antenna 601 and the duplexer/RF Top filter 602, which are shared with the Rx side, a Tx IF filter 621, a mixer 622, a Tx interstage filter 623, an amplifier 624, a coupler 625, an isolator 626, and an automatic power control (APC) 627.

The SAW filters according to the above-described preferred embodiments are preferably used for the duplexer/RF Top filter 602, the Rx interstage filter 604, and the Tx interstage filter 623.

The communication apparatus includes the SAW filter having a favorable transmission characteristic (wide pass band and large amount of attenuation outside the pass band). Therefore, favorable transmission/reception functions are obtained and the communication apparatus is miniaturized.

The SAW filter and the communication apparatus including the same according to various preferred embodiments of the present invention include a resin (insulating) pattern. Therefore, deterioration in transmission characteristics, for example, increase in insertion loss in the pass band and decrease in suppression level (attenuation) outside the pass band (particularly, in the high-frequency side) caused by parasitic capacitance between wiring (conductor) traces, is suppressed. Accordingly, the transmission characteristics are improved and the apparatus is miniaturized, and thus, the apparatus is preferably used in communication.

The present invention is not limited to the above-described preferred embodiments, but can be modified in the scope of the attached claims. Further, the technologies disclosed in the above-described preferred embodiments can be used in combination, as desired.

What is claimed is:

1. A surface acoustic wave filter comprising:
   a piezoelectric substrate;
   an insulating pattern disposed on the piezoelectric substrate and having permittivity less than that of the piezoelectric substrate; and
   a conductor pattern disposed on at least one of the piezoelectric substrate and the insulating pattern; wherein
   a portion of the conductor pattern defines IDTs and another portion of the conductor pattern defines wiring traces; and
   at a portion where wiring traces having different potentials face each other in a plan view, a ground wiring trace is disposed directly on the piezoelectric substrate; and
   at least one of the wiring traces having a different potential from that of the ground wiring trace is disposed on the insulating pattern.

2. A surface acoustic wave filter according to claim 1, wherein the conductor pattern includes a first conductor pattern disposed on the piezoelectric substrate, a portion thereof defining the IDTs, and a second conductor pattern which is in conduction with the first conductor pattern, a portion thereof being disposed on the insulating pattern.

3. A surface acoustic wave filter according to claim 1, wherein the relative permittivity of the insulating pattern is less than about 4.

4. A surface acoustic wave filter according to claim 1, wherein the relative permittivity of the piezoelectric substrate is about 20 or more.

5. A surface acoustic wave filter according to claim 4, wherein the piezoelectric substrate includes at least one of $LiTaO_3$, $LiNbO_3$, and $Li_2B_4O_7$.

6. A surface acoustic wave filter according to claim 1, wherein the center frequency of a pass band is about 500 MHz or more.

7. A surface acoustic wave filter according to claim 1, wherein the center frequency of a pass band is about 1 GHz or more.

8. A surface acoustic wave filter according to claim 1, wherein the surface acoustic wave filter has a balance-to-unbalance transformer function and includes a balanced signal terminal and an unbalanced signal terminal.

9. A surface acoustic wave filter according to claim 8, wherein at least one of a wiring trace connected to the balanced signal terminal and a wiring trace connected to the unbalanced signal terminal is disposed on the insulating pattern.

10. A communication apparatus comprising the surface acoustic wave filter according to claim 1.

11. A surface acoustic wave filter comprising:
    a piezoelectric substrate;
    an insulating pattern disposed on the piezoelectric substrate and having permittivity less than that of the piezoelectric substrate; and
    a conductor pattern disposed on at least one of the piezoelectric substrate and the insulating pattern; wherein
    a portion of the conductor pattern defines IDTs and another portion of the conductor pattern defines wiring traces; and at a portion where wiring traces having different potentials face each other in a plan view, at least a portion of at least one of the wiring traces is disposed on the insulating pattern; and the insulating pattern includes resin.

12. A surface acoustic wave filter comprising:

a piezoelectric substrate;

an insulating pattern disposed on the piezoelectric substrate and having permittivity less than that of the piezoelectric substrate; and a conductor pattern disposed on at least one of the piezoelectric substrate and the insulating pattern; wherein a portion of the conductor pattern defines IDTs and another portion of the conductor pattern defines wiring traces; and at a portion where wiring traces having different potentials face each other in a plan view, at least a portion of at least one of the wiring traces is disposed on the insulating pattern; and the insulating pattern has a thickness of about 0.5 μm or more.

* * * * *